United States Patent
Galambos et al.

(10) Patent No.: US 10,536,158 B2
(45) Date of Patent: Jan. 14, 2020

(54) ANALOG TO DIGITAL CONVERTER AND A METHOD FOR ANALOG TO DIGITAL CONVERSION

(71) Applicant: Analog Value Ltd., Rishon Lezion (IL)

(72) Inventors: Tiberlu Galambos, Binyamina (IL); Vladimir Koifman, Rishon Lezion (IL); Anatoli Mordakhay, Hadera (IL)

(73) Assignee: ANALOG VALUE LTD., Rishon Lezion (IL)

( * ) Notice: Subject to any disclaimer, the term of this patent is extended or adjusted under 35 U.S.C. 154(b) by 0 days.

(21) Appl. No.: 15/899,379

(22) Filed: Feb. 20, 2018

(65) Prior Publication Data

US 2018/0294818 A1 Oct. 11, 2018

Related U.S. Application Data

(63) Continuation of application No. 15/802,468, filed on Nov. 3, 2017, now Pat. No. 10,419,013, which is a continuation of application No. 15/472,277, filed on Mar. 29, 2017, now Pat. No. 9,813,076.

(60) Provisional application No. 62/315,695, filed on Mar. 31, 2016.

(51) Int. Cl.
   *H03M 1/12* (2006.01)
   *H03M 1/10* (2006.01)
   *H03M 1/50* (2006.01)

(52) U.S. Cl.
   CPC ....... *H03M 1/1245* (2013.01); *H03M 1/1009* (2013.01); *H03M 1/504* (2013.01); *H03M 1/1215* (2013.01)

(58) Field of Classification Search
   CPC .. H03M 1/1245; H03M 1/504; H03M 1/1009; H03M 1/1215
   USPC ......................................... 341/155, 131, 135
   See application file for complete search history.

(56) References Cited

U.S. PATENT DOCUMENTS

| | | | | |
|---|---|---|---|---|
| 4,550,307 A * | 10/1985 | Akashi | ..................... | H03M 1/86 327/174 |
| 5,905,406 A * | 5/1999 | Sugden | ............... | H04L 25/4902 329/312 |
| 6,157,671 A * | 12/2000 | Young | ...................... | H03K 5/19 329/312 |
| 6,181,266 B1 * | 1/2001 | Toki | ........................ | G06F 1/025 341/152 |
| 6,850,177 B2 * | 2/2005 | Donovan | ................ | H03M 1/68 341/144 |

(Continued)

*Primary Examiner* — Jean B Jeanglaude
(74) *Attorney, Agent, or Firm* — Reches Patents

(57) ABSTRACT

An ADC that includes a processing unit configured to receive from first sampling latches N first PWM pulse start counter values and N first PWM pulse end counter value, receive from second sampling latches, N second PWM pulse start counter values and N second PWM pulse end counter value; (c) select a counter that is coupled to a selected sampling latch; (d) calculate an estimated difference between first and second input analog signals based on at least readings of the selected latch. The readings of the selected counter include a first PWM pulse start counter value latched by the selected latch, a first PWM pulse end counter value latched by the selected latch, a second PWM pulse start counter value latched by the selected latch, and a second PWM pulse end counter value latched by the selected latch; and (e) output a digital output signal indicative of the estimated difference.

11 Claims, 24 Drawing Sheets

(56) References Cited

U.S. PATENT DOCUMENTS

| | | | |
|---|---|---|---|
| 6,900,994 B2 * | 5/2005 | Asayama | H02M 3/33515 363/21.01 |
| 7,227,476 B1 * | 6/2007 | Wong | H03M 5/08 341/53 |
| 7,382,301 B2 * | 6/2008 | Mourrier | H03M 1/822 341/144 |
| 7,554,372 B1 * | 6/2009 | Wong | H02M 3/157 327/172 |
| 7,791,387 B1 * | 9/2010 | Wong | H03K 7/08 327/172 |
| 8,508,399 B2 * | 8/2013 | Lee | H03M 1/1215 341/155 |
| 2002/0097176 A1 * | 7/2002 | Herbold | H03L 7/0996 341/155 |
| 2009/0256601 A1 * | 10/2009 | Zhang | H03L 7/085 327/156 |

* cited by examiner

ANALOG TO DIGITAL CONVERTER AND A METHOD FOR ANALOG TO DIGITAL CONVERSION

CROSS REFERENCE

This application is a continuation of U.S. patent application Ser. No. 15/802,468 filing date Nov. 3, 2017 which is a continuation in part of U.S. patent application Ser. No. 15/472,277 filing date Mar. 29, 2017 that claims priority from US provisional patent Ser. No. 62/315,695 filing date Mar. 31 3016—all are incorporated herein by reference.

BACKGROUND

Analog to digital converter convert analog signals to digital signals.

There is a growing need to provide a highly accurate and efficient analog to digital converter.

SUMMARY

According to an embodiment of the invention there may be provided an analog to digital converter that may include a multi-phase clock unit that may be configured to output multiple phase-shifted clock signals that may be phase shifted from each other; a first sampler that may be configured to sample, during a sampling iteration, a first input analog signal to provide a first voltage signal that represents the first input analog signal; a first pulse width modulation (PWM) modulator that may be coupled to the first sampler and may be configured to generate a first PWM pulse that represents the first voltage signal; a second sampler that may be configured to sample, during the sampling iteration, a second input analog signal to provide a second voltage signal that represents the second input analog signal; a second PWM modulator that may be coupled to the second sampler and may be configured to generate a second PWM pulse that represents the second voltage signal; N counters, wherein different counters may be fed by different phase-shifted clock signals, wherein the different phase-shifted clock signals may be evenly phase shifted from each other; N being an integer; N pairs of sampling latches; wherein different pairs of sampling latches may be coupled to different counters; and a processing unit; wherein a first sampling latch of each pair may be configured to sample an output of a corresponding counter at (a) a start of the first PWM pulse, and at (b) an end of the first PWM pulse, to provide a first PWM pulse start counter value and a first PWM pulse end counter value; wherein a second sampling latch of each pair may be configured to sample an output of a corresponding counter at (a) a start of the second PWM pulse, and at (b) an end of the second PWM pulse, to provide a second PWM pulse start counter value and a second PWM pulse end counter value; wherein the processing unit may be configured to (a) receive from first sampling latches of the N pairs of sampling latches, N first PWM pulse start counter values and N first PWM pulse end counter value, (b) receive from second sampling latches of the N pairs of sampling latches, N second PWM pulse start counter values and N second PWM pulse end counter value; (c) select a counter that may be coupled to a selected sampling latch; (d) calculate an estimated difference between the first input analog signal and the second input analog signal based on at least readings of the selected latch; wherein the readings of the selected counter may include a first PWM pulse start counter value latched by the selected latch, a first PWM pulse end counter value latched by the selected latch, a second PWM pulse start counter value latched by the selected latch, and a second PWM pulse end counter value latched by the selected latch; and (e) output a digital output signal indicative of the estimated difference. See, for example, FIG. 19)

The N counters may be configured to be reset between one sampling iteration to another.

Each counter of the N counters may be configured to count a period that may be at least twice a sampling cycle; and wherein the processing unit may be configured to detect counter overflow based on a difference between PWM pulse end and start counter values.

The digital to analog converter may include an initial pair of sampling latches that may be configured to detect during which phase-shifted clock signal of the output multiple phase-shifted clock signals the first PWM pulse ended and during which phase-shifted clock signal of the output multiple phase-shifted clock signals the second PWM pulse ended.

The digital to analog converter may include a pair of bubble correct and encode units that may be coupled between the initial pair of sampling latches and the processing unit.

Each sampling latch of the initial pair of latches may include a phase clock interpolating circuit for interpolating the multiple phase-shifted clock signals.

The phase clock interpolating circuit may include a first group of parallelly coupled transistors that may be fed by a first group of phase-shifted signals, a second group of parallelly coupled transistors that may be fed by a second group of phase-shifted signals; a first inverter that may be coupled to the first group, a second inverter that may be coupled to the second group; wherein the first inverter may be configured to switch between operation modes based on a conductance of the first group and on the first PWM pulse; and wherein the second inverter may be configured to switch between operation modes based on a conductance of the second group and on the second PWM pulse.

There may be provided a digital to analog converter that may include a third sampler that may be configured to sample, during a sampling iteration, a third input analog signal to provide a third voltage signal that represents the third input analog signal; a third PWM modulator that may be coupled to the third sampler and may be configured to generate a third PWM pulse that represents the third voltage signal; a fourth sampler that may be configured to sample, during the sampling iteration, a fourth input analog signal to provide a fourth voltage signal that represents the fourth input analog signal; a fourth PWM modulator that may be coupled to the fourth sampler and may be configured to generate a fourth PWM pulse that represents the fourth voltage signal; and N pairs of additional sampling latches; wherein different pairs of additional sampling latches may be coupled to different counters; and an additional processing unit; wherein a third sampling latch of each pair may be configured to sample an output of a corresponding counter at (a) a start of the third PWM pulse, and at (b) an end of the third PWM pulse, to provide a third PWM pulse start counter value and a third PWM pulse end counter value; wherein a fourth sampling latch of each pair may be configured to sample an output of a corresponding counter at (a) a start of the fourth PWM pulse, and at (b) an end of the fourth PWM pulse, to provide a fourth PWM pulse start counter value and a fourth PWM pulse end counter value; wherein the additional processing unit may be configured to (a) receive from third sampling latches of the N pairs of sampling latches, N third PWM pulse start counter values and N third PWM pulse end counter value, (b) receive from fourth sampling latches of the N pairs of sampling latches, N fourth PWM pulse start counter values and N fourth PWM pulse end counter value; (c) select a counter that may be coupled to a selected sampling latch; (d) calculate an estimated difference between the third input analog signal and the fourth input analog signal based on at least readings of the selected latch; wherein the readings of the selected counter may include a third PWM pulse start counter value latched by the selected latch, a third PWM pulse end counter value latched by the selected latch, a fourth PWM pulse start counter value latched by the selected latch, and a fourth PWM pulse end counter value latched by the selected latch; and (e) output a digital output signal indicative of the estimated difference.

There may be provided a method for analog to digital conversion, the method may include outputting, by a multi-phase clock unit, multiple phase-shifted clock signals that may be phase shifted from each other; sampling, by a first sampler, during a sampling iteration, a first input analog signal to provide a first voltage signal that represents the first input analog signal; generating, by a first pulse width modulation (PWM) modulator that may be coupled to the first sampler, a first PWM pulse that represents the first voltage signal; sampling, by a second sampler, during the sampling iteration, a second input analog signal to provide a second voltage signal that represents the second input analog signal; generating, by a second PWM modulator that may be coupled to the second sampler, a second PWM pulse that represents the second voltage signal; feeding N counters by the multiple phase-shifted clock signals, wherein the different counters may be fed by different phase-shifted clock signals that may be evenly phase shifted from each other; N being an integer; sampling, by a first sampling latch of each pair of N sampling latches, an output of a corresponding counter at (a) a start of the first PWM pulse, and at (b) an end of the first PWM pulse, to provide a first PWM pulse start counter value and a first PWM pulse end counter value; sampling, by a second sampling latch of each pair of N sampling latches, an output of a corresponding counter at (a) a start of the second PWM pulse, and at (b) an end of the second PWM pulse, to provide a second PWM pulse start counter value and a second PWM pulse end counter value; receiving, by a processing unit, from first sampling latches of the N pairs of sampling latches, N first PWM pulse start counter values and N first PWM pulse end counter value; receiving, by the processing unit, from second sampling latches of the N pairs of sampling latches, N second PWM pulse start counter values and N second PWM pulse end counter value; selecting, by the processing unit, a counter that may be coupled to a selected sampling latch; calculating, by the processing unit, an estimated difference between the first input analog signal and the second input analog signal based on at least readings of the selected latch; wherein the readings of the selected counter may include a first PWM pulse start counter value latched by the selected latch, a first PWM pulse end counter value latched by the selected latch, a second PWM pulse start counter value latched by the selected latch, and a second PWM pulse end counter value latched by the selected latch; and outputting a digital output signal indicative of the estimated difference.

There may be provided an analog to digital converter may include a multi-phase clock unit that may be configured to output multiple phase-shifted clock signals that may be phase shifted from each other; a first voltage to time sampling de-multiplexer that may include a first demultiplexer and first plurality of first time to voltage units; wherein the first demultiplexer may be configured to receive a sequence of first plurality of first input analog signals, and to distribute the sequence of first plurality of first input analog signals between the first plurality of first voltage to time units, so that each first voltage to time unit receives a different first input analog signal of the sequence of first plurality of first input analog signals; wherein each first voltage to time unit may include a first voltage dependent delay circuit (such as but not limited to an inverter) that may be configured to output a first pulse that has a duration that may be indicative of a value of a first input analog signal fed to the first voltage to time unit; a second voltage to time sampling de-multiplexer that may include a second demultiplexer and first plurality of second time to voltage units; wherein the second demultiplexer may be configured to receive a sequence of first plurality of first input analog signals, and to distribute the sequence of first plurality of second input analog signals between the first plurality of second voltage to time units, so that each second voltage to time unit receives a different second input analog signal of the sequence of first plurality of second input analog signals; wherein each second voltage to time unit may include a second voltage dependent delay circuit that may be configured to output a second pulse that has a duration that may be indicative of a value of a second input analog signal fed to the second voltage to time unit; a second plurality of counters, wherein different counters may be fed by different phase-shifted clock signals, wherein the different phase-shifted clock signals may be evenly phase shifted from each other; first plurality of being an integer; a first plurality of pairs of timing units; wherein each pair of timing units may be (a) coupled to a different pair of first time to voltage unit and a second time to voltage unit, and (b) may be configured to determine a difference in phase-shifted clock signals between an end of the first pulse generated by the first time to voltage unit and an end of the second pulse generated by the second time to voltage unit; and at least one processing unit that may be fed by the first plurality of timing unit and may be configured to generate a first plurality of digital output signals indicative of differences between the first plurality of first input analog signals and corresponding second plurality of second input analog signals. See, for example, FIG. 22).

Each timing unit may include a latch that may be configured to determine during which phase-shifted clock signal the end of the first pulse occurred, during which phase-shifted clock signal the end of the second pulse occurred; and to determine whether any counter value changed between the ends of the first and second pulses.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

Figure 1:
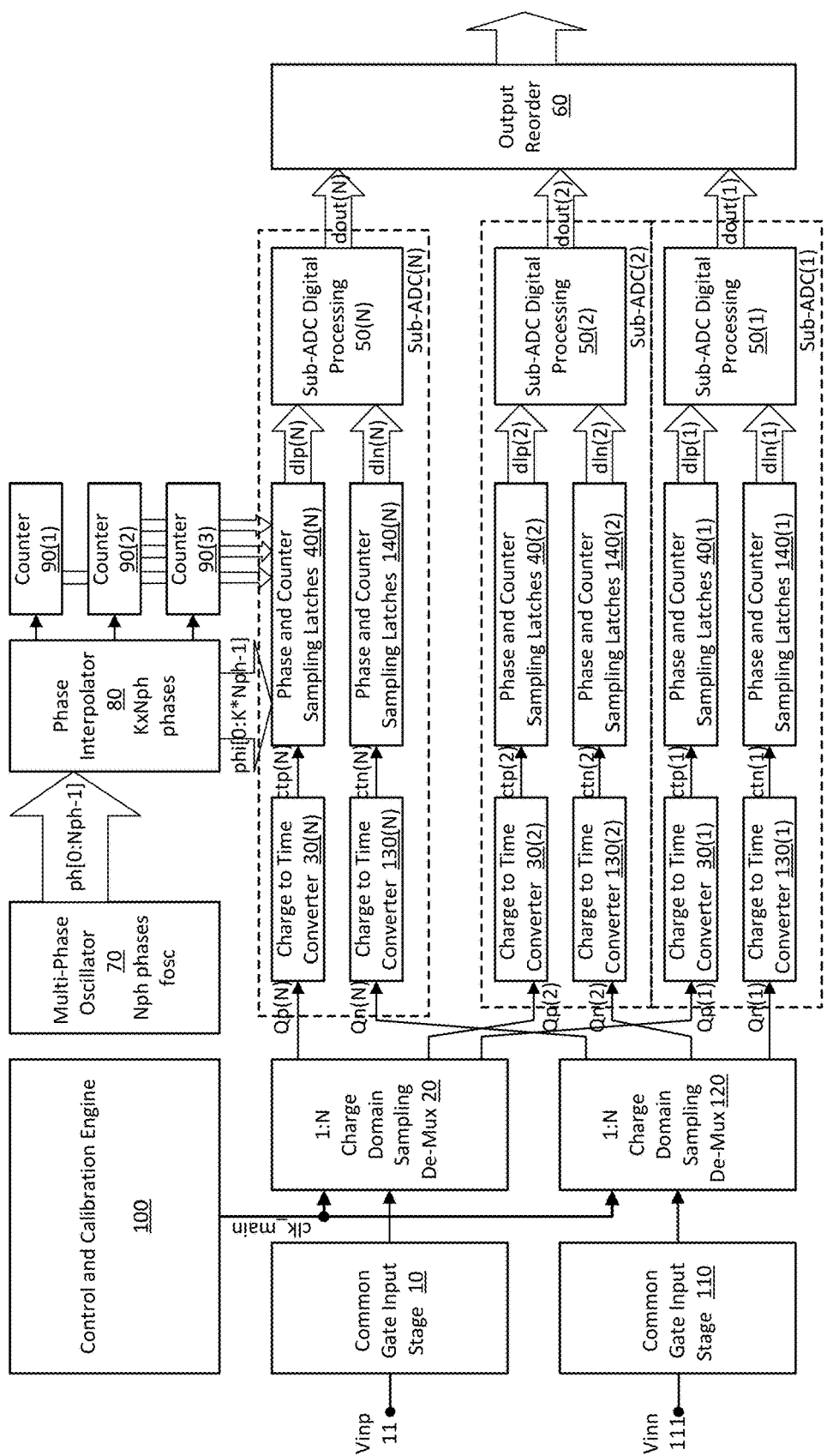
FIG. 1 illustrates circuits of an analog to digital converter according to an embodiment of the invention.

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Any reference in the specification to a system should be applied mutatis mutandis to a method that may be executed by the system.

The following abbreviations/symbols are used in the specification or drawings:
 a. ADC—analog to digital converter.
 b. CM—charge memory unit.
 c. CM and PWM Mod—charge memory unit and PWM modulator.
 d. De-Mux—de-multiplexor.
 e. N—a positive integer that exceeds 1 and may exceed 30, 120 and the like.
 f. PWM—Pulse width modulation. PWM is a modulation scheme that converts an input signal to an output pulse. The width of the pulse represents the value of the input signal.
 g. PWM Mod—PWM modulator.
 h. Vgs—gate source voltage (of a transistor).
 i. Thermo Encoder—a logic circuit that may include but is not limited to a thermometer code to binary code encoder.

According to various embodiment of the invention there is provided an analog to digital converter in which an analog current is sampled by a sampler (that is controlled by a sampler clock signal) to generate a series of current pulses.

Charge packets that reflect the series of current pulse are fed through a de-multiplexor to a group of charge memory units, and are stored at a group of charge memory units.

Control signals of different charge memory units are shifted from each other so that different charge memory units receive charge packets from different current pulses.

Each charge memory unit may receive a charge packet related to given current pulse during a reception period that (a) starts at a start point of time that precedes the given current pulse and occurs between current pulses, and (b) ends at an end point of time that follows the given current point of time and occurs between current pulses.

The timing the start and end of the reception period to be between current pulses prevents the start and the end of the reception period affect the sampling instances that are solely defined by the sampler clock signal.

This eliminates the need to perform timing calibration that for other time interleaved ADC architectures is one of the most complex calibration task.

FIG. 1 illustrates circuits of an analog to digital converter (ADC).

The ADC is a differential time interleaved ADC that is configured to perform a two-step time domain digitization using a multi-phase oscillator followed by interpolation/averaging for the first step and a set of counters for the second step.

The ADC receives differential input signals Vinp 11 and Vinn 111 and output a signal that is indicative of a difference between Vinp 11 and Vinn 111.

Common gate input stage 10 converts Vinp 11 to a current signal that is fed to 1:N charge domain sampling de-multiplexer 20.

The 1:N charge domain sampling de-multiplexer 20 includes a sampler that is fed by a sampler clock signal and a 1 to N de-multiplexer.

Common gate input stage 110 converts Vinn 111 to a current signal that is fed to 1:N charge domain sampling de-multiplexer 120.

The 1:N charge domain sampling de-multiplexer 120 includes a sampler that is fed by a sampler clock signal and a 1 to N de-multiplexer.

Each one of the charge domain sampling de-multiplexer 20 and the charge domain sampling de-multiplexer 120 distributes (de-multiplexes) the current signal to N sub-ADC modules Sub-ADC(1)-Sub-ADC(N).

Each sub-ADC module may include, for example, charge to time converters 30(1)-30(N) and 130(1)-130(N), phase and counter sampling latches 40(1)-40(N) and 140(1)-140(N), and sub-ADC digital processing circuits 50(1)-50(N).

Charge to time converters 30(1)-30(N) are fed by charge domain sampling de-multiplexer 20. Charge to time converters 130(1)-130(N) are fed by charge domain sampling de-multiplexer 120.

Phase and counter sampling latches 40(1)-40(N) are fed by charge to time converters 30(1)-30(N).

Phase and counter sampling latches 140(1)-140(N) are fed by charge to time converters 130(1)-130(N).

For index n between 1 and N, phase and counter sampling latches 40(n) and 140(n) feed sub-ADC digital processing circuits 50(n).

Sub-ADC digital processing circuits 50(1)-50(N) feed output reorder unit 60.

Reorder unit 60 (may be a processor such as but not limited to logic state machine) may processes the outputs of sub-ADC digital processing circuits 50(n) to provide an output ADC signal. Re-order unit 60 may be configured to re-order the digital outputs and can also do tasks related to calibration that are done in the digital domain.

The ADC also may include a control and calibration engine 100 that is arranged to calibrate the different analog circuits—for example to equalize the offsets, gains and bandwidths and any other parameters of the different charge memory cells and/or of the charge to time convertors—or any other circuit of the ADC.

FIG. 1 also illustrates a multi-phase oscillator and interpolator 70 that may generate multiple clock phases. The multi-phase oscillator and interpolator 70 may include a phase lock loop (PLL) such as but not limited to the PLL of "A 1.25-GHz 0.35-_m Monolithic CMOS PLL Based on a Multiphase Ring Oscillator", L. Sun and T. A. Kwasneiwski, IEEE Journal of solid-state circuits, Volume 36, number 6, June 2001. The multi-phase oscillator and interpolator 50 may also include counters such as counter A 85, Counter B 86 and counter C 87 of FIG. 3 that are about 120 degrees phased shifted from each other. Implementations are possible that contain Nc>=3 counters that are shifted about 360/Nc degrees from each other.

The number of clock phases generated by the multi-phase oscillator and interpolator 50 may be, for example 124. The clock phases may be single ended or differential.

For the time domain digitization a multi-phase oscillator 70 generates clock phases ph[0:Nph] that are further interpolated, averaged and reduced in voltage swing by phase interpolator 80 that generates the interpolated phases phi[0: K*Nph−1]. For the coarse time to digital conversion step, a set of 3 counters 90(1) . . . 90(3) is used.

In each sub-ADC, the pair of charge packets Qp(n), Qn(n) it receives is converted by charge to time converter units 30(n) (130(n)) into the time difference between the edges (for example rising edges) of two signals ctp(n) and ctn(n). These signal edges are used by the sampling latches 40(n) (140(n)) to sample the interpolated phases phi[0:K*Nph−1] for the first step (fine) conversion and the outputs of the counters 90(1) . . . 90(3) for the second step (coarse) conversion. The outputs of the sampling latches are processed by the digital blocks 50(n). The final output of the ADC is re-assembled and formatted by output reorder block 60.

Figure 2:
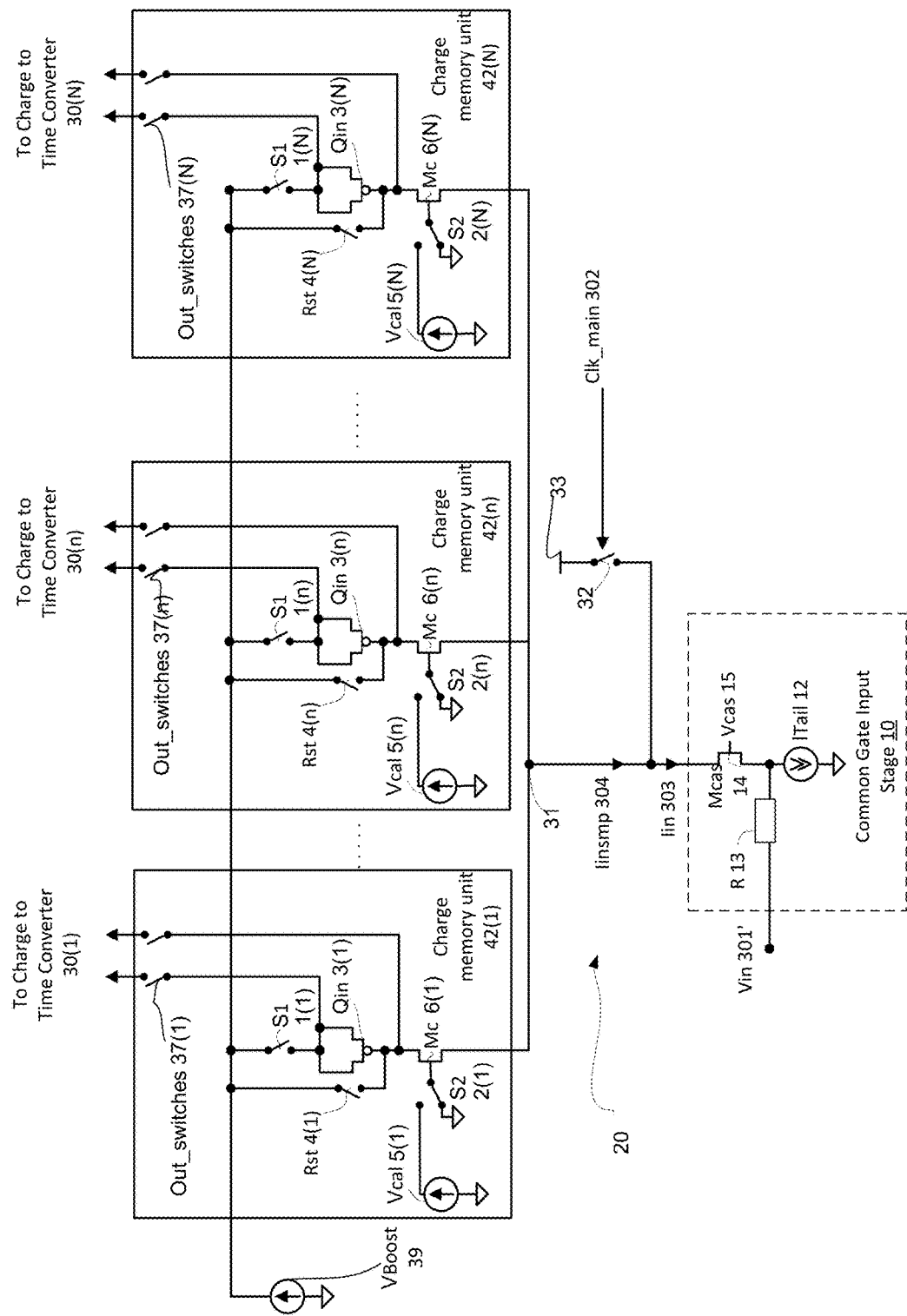
FIG. 2 illustrates circuits of an analog to digital converter according to an embodiment of the invention.

FIG. 2 illustrates common gate input stage 10, 1:N charge domain sampling de-multiplexer 20 and N charge memory cells 42(1)-42(N) of N modules 40(1)-40(N).

Common gate input stage 10 receives Vin' 301 and converts Vin' 301 to a current signal that is fed to 1:N charge domain sampling de-multiplexer 20.

The 1:N charge domain sampling de-multiplexer 20 includes sampler (such as switch 32 that is coupled to a positive potential 33) and is fed by a sampler clock signal Clk_main 302.

The 1:N charge domain sampling de-multiplexer 20 also includes 1 to N de-multiplexer 31 that is coupled in parallel to N charge memory cells 42(1)-42(N).

Common gate input stage 10 includes an input port for receiving Vin 301', a resistor R 13 that is connected between the input port and a node. The node is connected to a reference current source ITail 12 and to a transistor Mcas 14 that has a gate that is controlled by control signal Vcas 15.

Iin 303 is drained by transistor Mcas 14 when the transistor is open.

The common gate input stage 10 performs the conversion of Vin 301' to current, governed by the following basic linear equation:

$$Iin=Itail-(Vin-Vcas-VgsMcas)/R$$

Various techniques (not shown here) can be employed to correct the non-linear effects that are associated with this circuit. These techniques may be applied by calibration engine 100 of FIG. 1.

The input signal in 303 is sampled by sampler that steers away the current to positive supply 33 using switch 32 that is controlled by the clock Clk_main.

The sampler converts the input signal Iin 303 to a series of current pulses Iinsmp 304, and the charge (time integral) of each current pulse containing the information of one input signal sample is received by one of the charge memory banks.

Each charge memory unit may store the charge on linear capacitors or on non-linear MOS capacitors as shown in FIG. 2. The use of MOS capacitors has the advantage of lower kTC noise associated with the signal sampling and the storage reset performed here.

The fact that the switches of the charge memory units are operated in the time intervals when Iinsmp is 0 (between current pulses) prevents the timing of these events to affect the sampling instances that are solely defined by Clk_main.

Each one of the charge memory cells includes first switch, second switch, a charge memory element (such as transistor Qin), reset switch, input transistor Mc, calibration voltage source Vcal, and output ports.

Charge memory unit 42(1) includes first switch S1 1(1), second switch S2 2(1), charge memory element Qin 3(1), reset switch Rst 4(1), input transistor Mc 6(1), Vcal 5(1), and output ports for outputting an output signal to PWM modulator 30(1) by closing output switches 37(1) using control signals out_switches_Cntr 38(1).

Charge memory unit 42($n$) includes first switch S1 1($n$), second switch S2 2($n$), charge memory element Qin 3($n$), reset switch Rst 4($n$), input transistor Mc 6($n$), Vacl 5($n$), and output ports for outputting the charge packet. The charge packet is outputted to PWM modulator 30($n$). The charge packet is outputted to PWM modulator 30($n$) by closing output switches 37($n$) using control signals out_switches_Cntr (denoted 38($n$) in FIG. 3)).

Variable n may range between 1 and N.

Figure 3:
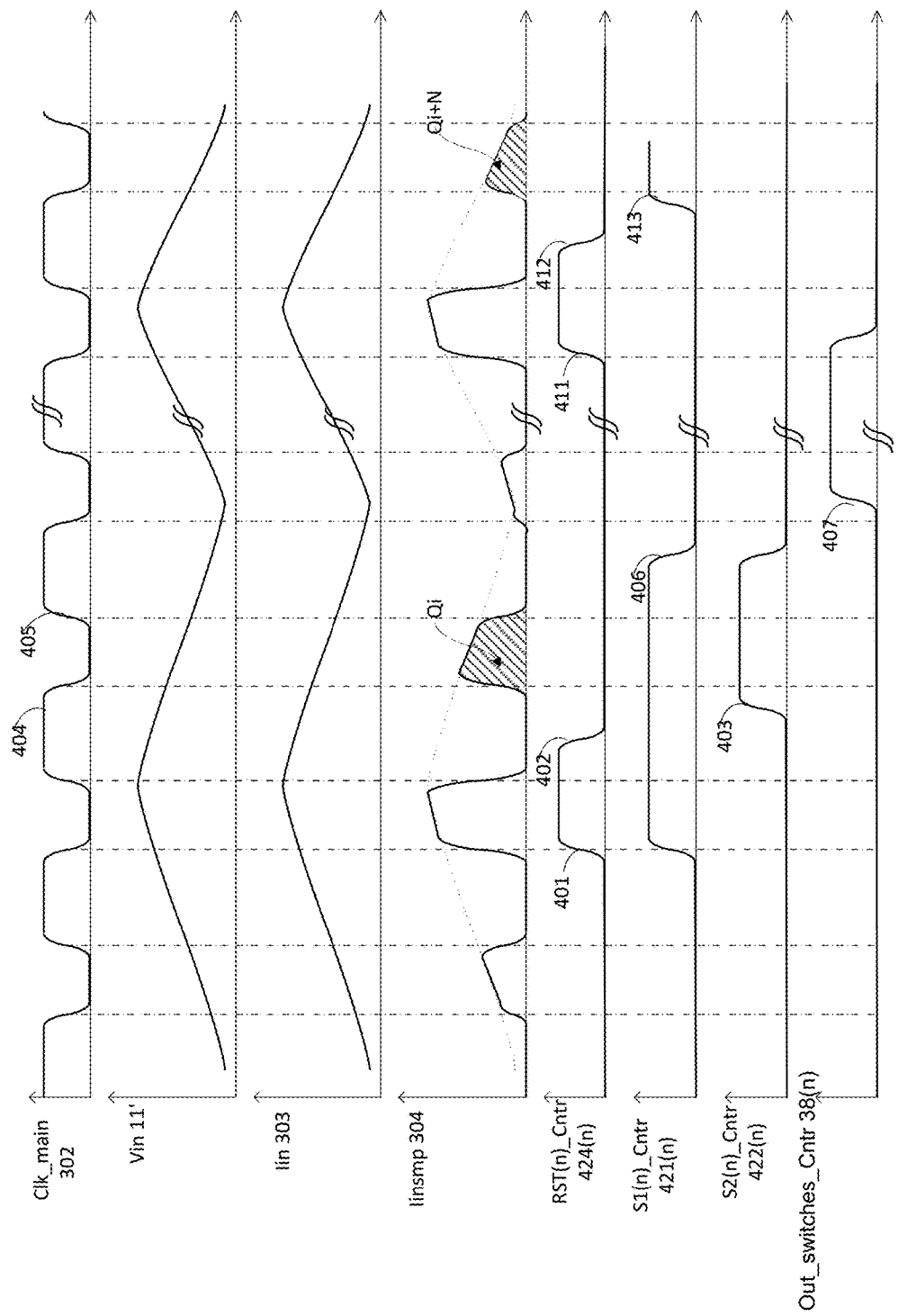
FIG. 3 illustrates a timing diagram of signals generated by circuits of an analog to digital converter according to an embodiment of the invention.

The operating sequence for charge memory unit 42($n$) is shown in FIG. 3.

Reset switch Rst 4($n$) is controlled by control signal Rst(n)_Cntr 424($n$). First switch 1($n$) is controlled by control signal S1($n$)_Cntr 421($n$). Second switch 2($n$) is controlled by control signal S2($n$)_Cntr 422($n$).

The operating sequence includes:
a. The charge memory unit n is reset (401). S1($n$) 1($n$) and RST(n) 4($n$) are closed.
b. The reset ends (402) at the opening of Rst(n) 4($n$).
c. The charge memory unit 42($n$) is connected to the sampled input current by closing(403) S2($n$).
d. The integration of the input sample starts with the opening (404) of the Sampler switch 32.
e. The integration of the input sample ends with the closing (405) of the Sampler switch.
f. Charge memory unit 42($n$) is disconnected (406) from the input circuit by opening of switches S1($n$) 1($n$) and S2($n$) 2($n$).
g. Charge memory unit 42(2) is connected (407) to the PWM modulator 30($n$) by closing output switches 37($n$)—by out_switches_Cntr 38($n$).

Figure 4:
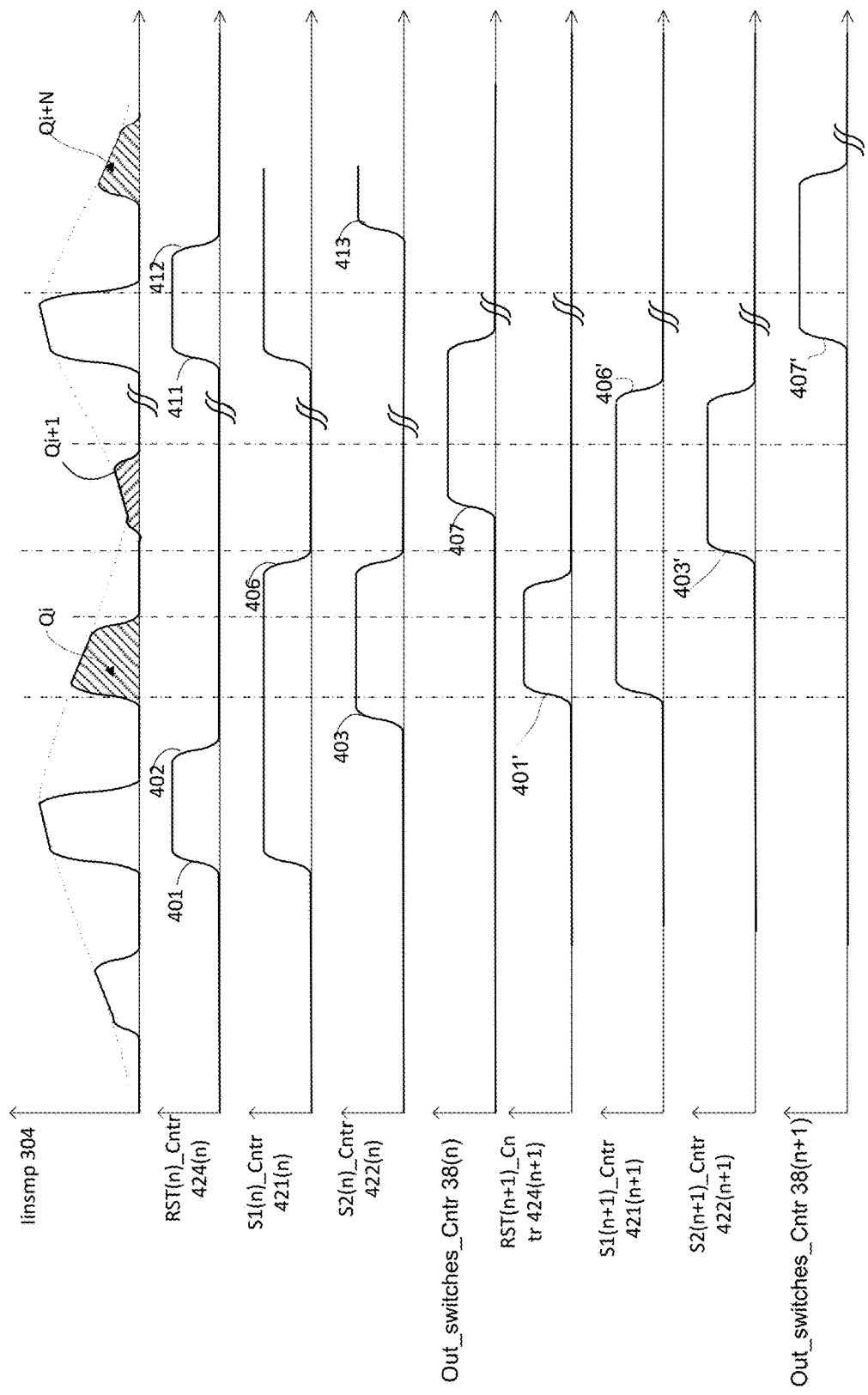
FIG. 4 illustrates a timing diagram of signals generated by circuits of an analog to digital converter according to an embodiment of the invention.

The operating sequence for charge memory unit 42($n$) and for another charge memory unit 42($n$+1) is shown in FIG. 4. FIG. 4 illustrates that charge memory unit 42($n$+1) is activated at the same manner as charge memory unit 42($n$)—but samples the next current pulse Qi+1. See events 401', 402', 403', 406' and 407' that correspond to events 401, 402, 403, 406 and 407—but one current pulse later.

Figure 5:
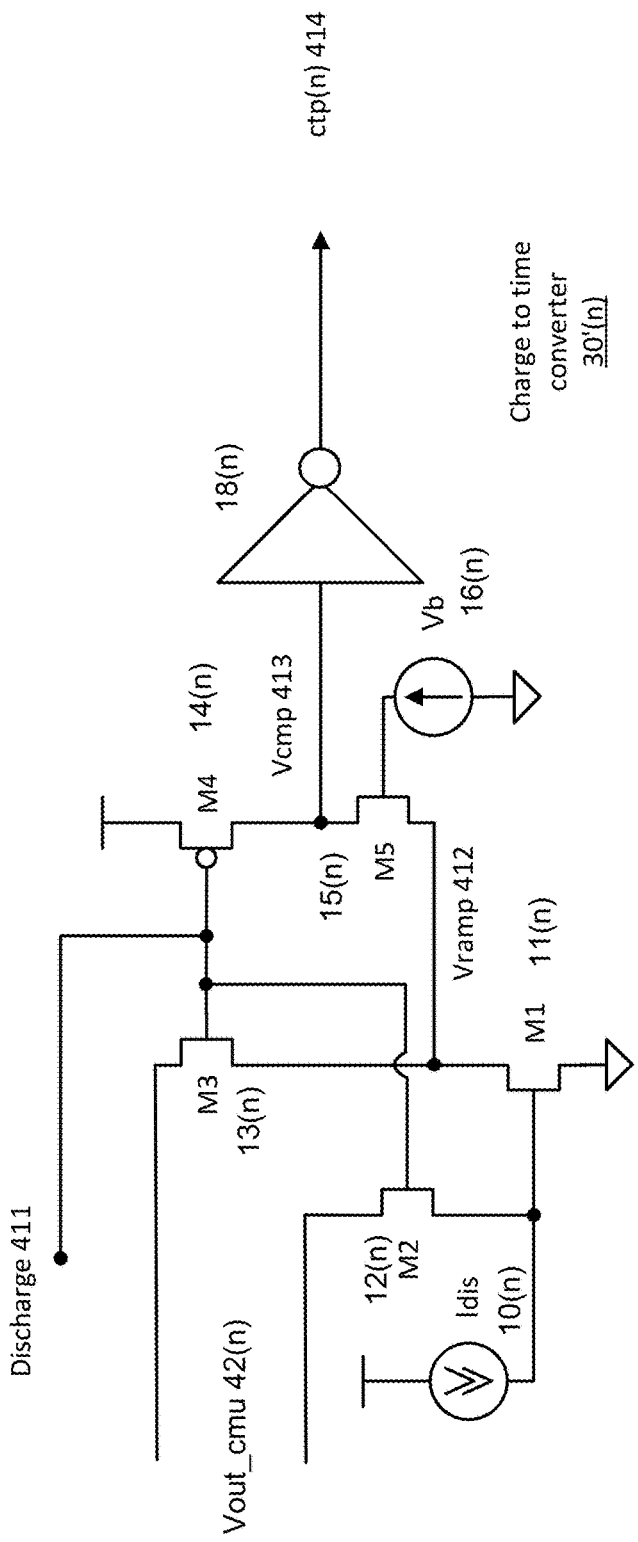
FIG. 5 illustrates circuits of an analog to digital converter according to an embodiment of the invention.
Figure 6:
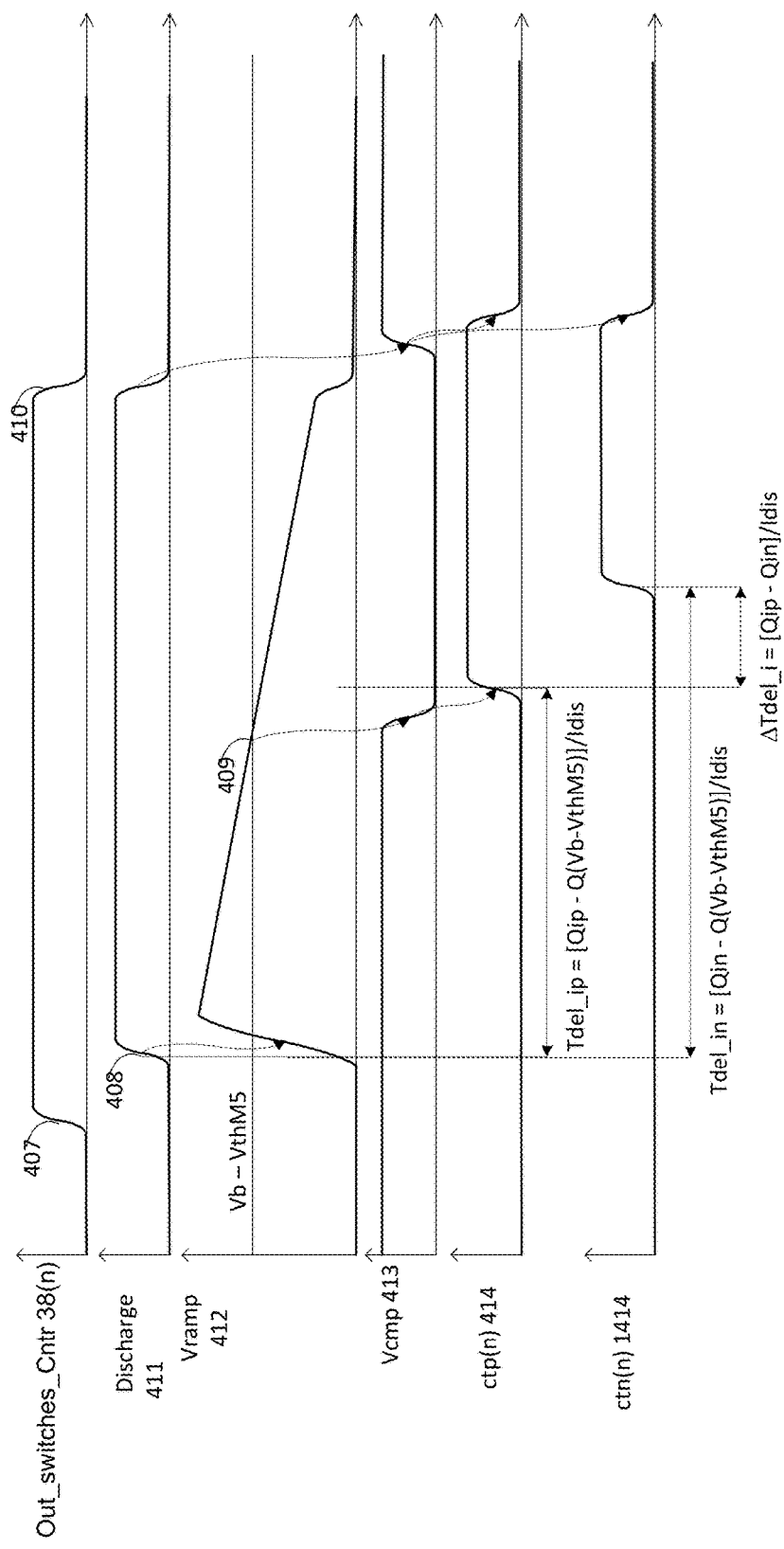
FIG. 6 illustrates a timing diagram of signals generated by circuits of an analog to digital converter according to an embodiment of the invention.

FIG. 5 illustrates a charge to time converter 30($n$) (one of the two instances used by each sub-ADC channel). The associated waveforms are shown in FIG. 6. It is to be noted that various different implementations can be conceived that convert the charge packet into the timing of a rising or falling signal edge using positive or negative ramp signals.

Charge to time converter 30($n$) includes current source Idis 10($n$), first transistor M1 11($n$), second transistor M2 12($n$), third transistor M3 13($n$), fourth transistor M4 14($n$), fifth transistor M5 15($n$), discharge port for receiving a discharge signal 411, bias voltage source Vb 16($n$), inverter 18($n$), and an output port for outputting pulses ctp(n)—see timing diagram of FIG. 6.

Second transistor M2 12($n$) and third transistor M3 13($n$) operate as switches connecting the charge memory capacitor in the feedback loop between the gate and drain of the first transistor M1 11($n$) that operates as an integrating device M1. Fourth transistor M4 11(4) and fifth transistor M5 15($n$) form a pre-charged comparator stage, the trigger point of which is set by Vb-Vth M5.

The operating sequence presented in FIG. 6 is the continuation of the sequence discussed in FIG. 3 and is as follows:
a. The charge packet starts (408) the discharge process at the rising edge of Discharge signal 411 (408). This also creates the start of the output PWM pulse.
b. When the ramp voltage discharges to the trigger point of the pre-charged comparator (that is Vb—VthM5) transistor M5 starts (409) to conduct and discharges the dynamic node of the comparator Vcmp. This marks the end of the PWM pulse.
c. The charge memory is disconnected (410) from the PWM circuit (opening Out_switches 37($n$) and driving the Discharge signal low).
d. On FIG. 3 the charge memory unit is now reset (411), it's reset ends (412) and is opened to receive the next charge packet Qi+N (413).

It should be noted that implementations might be possible in which the functionality of the output switches of the charge memory cell 42($n$) performed by M3 and M2 and there is no need for the output switches.

Figure 7:
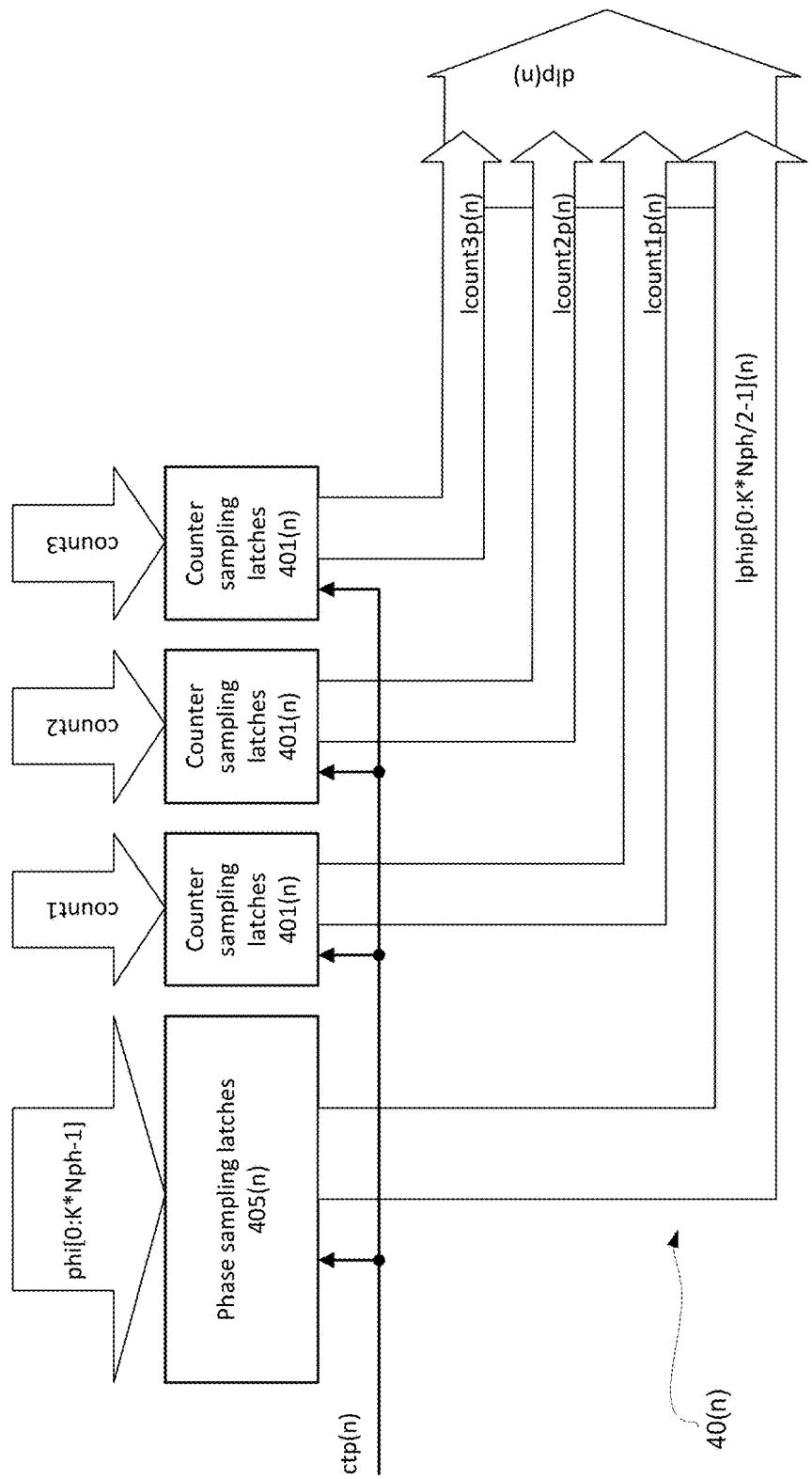
FIG. 7 illustrates circuits of an analog to digital converter according to an embodiment of the invention.
Figure 8:
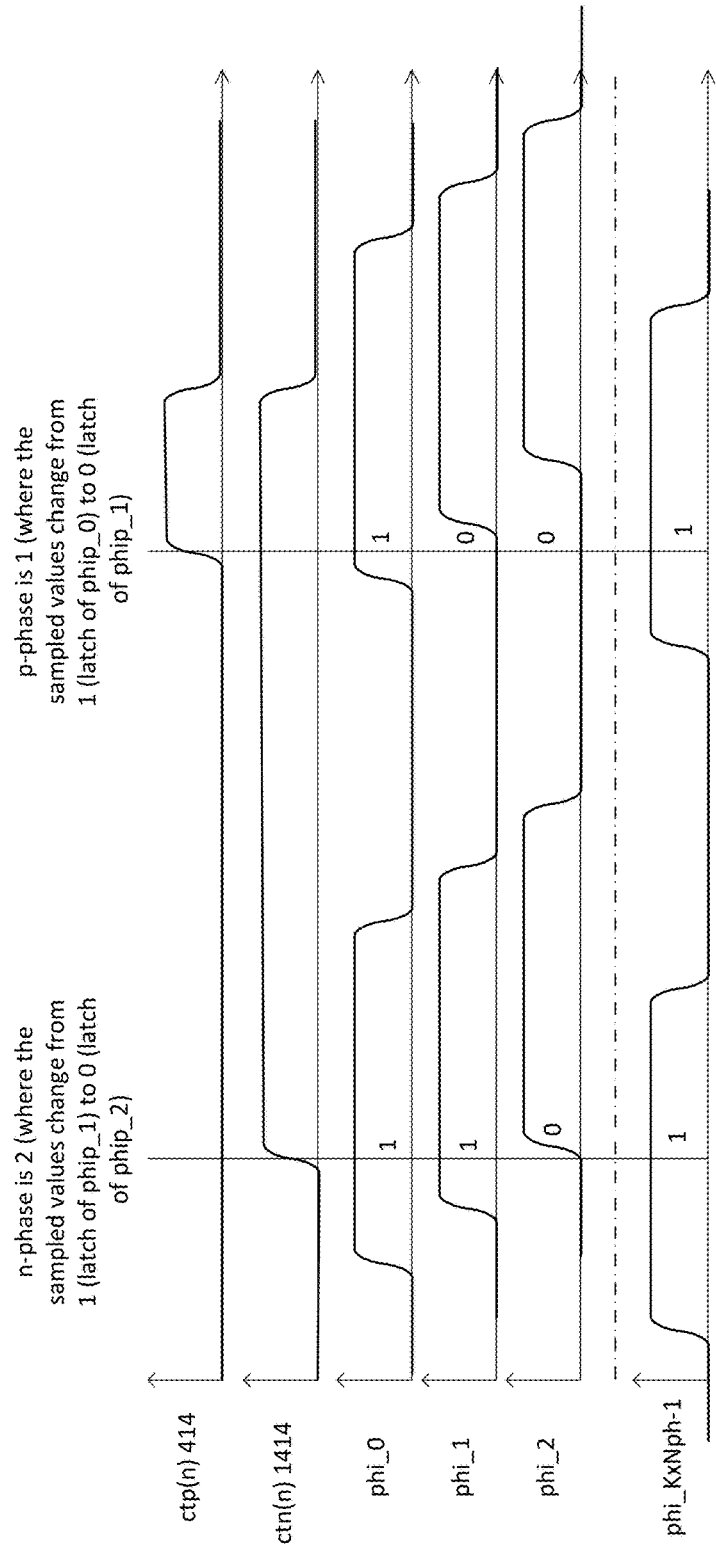
FIG. 8 illustrates a timing diagram of signals generated by circuits of an analog to digital converter according to an embodiment of the invention.

The block of phase and counter sampling latches of which each sub-ADC uses two 40($n$) and 140($n$) is shown in FIG. 7. The way in which the time of the sampling instance is converted into a digital number (for the fine bits) is shown in FIG. 8.

Figure 9:
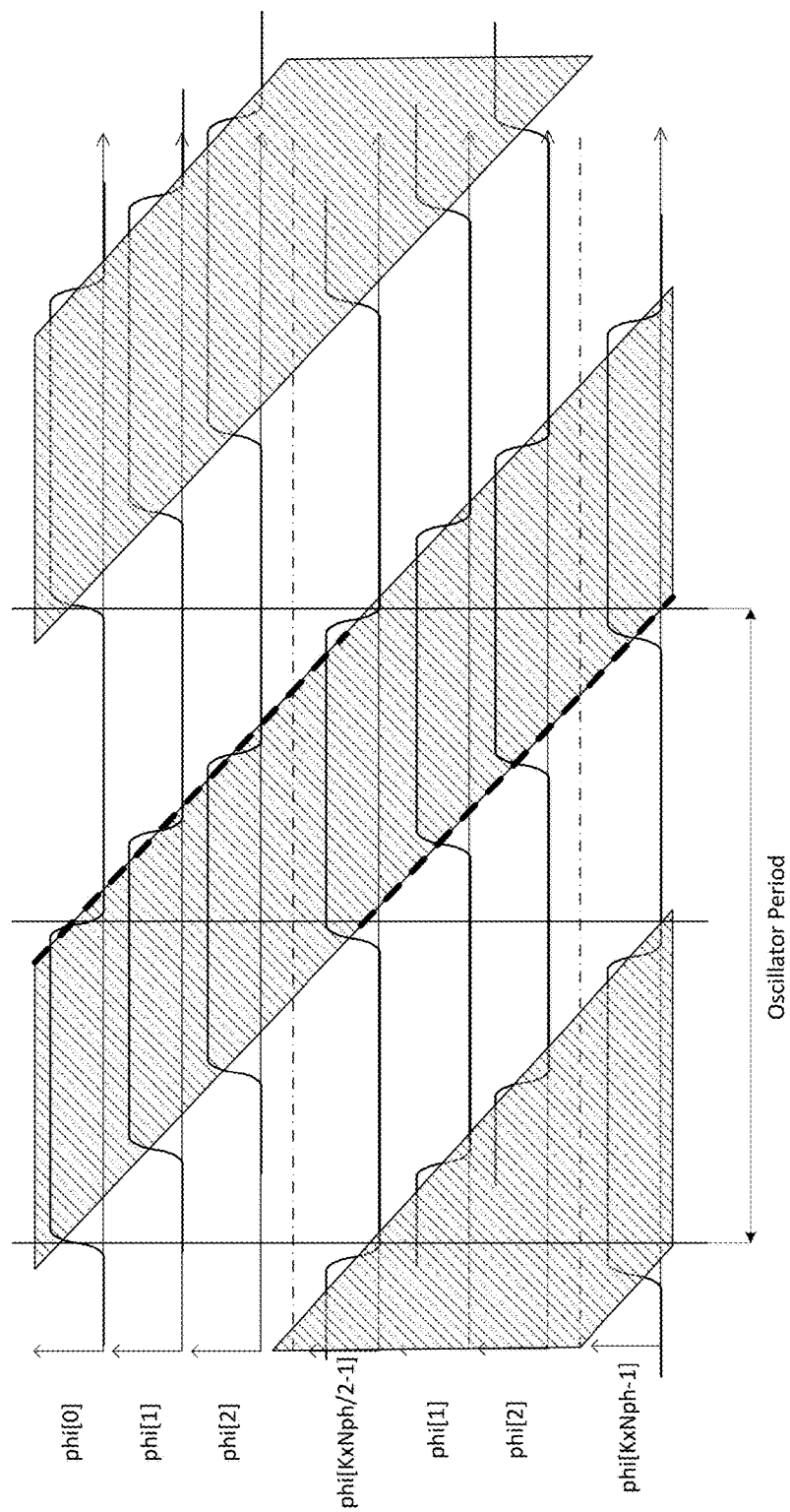
FIG. 9 illustrates a timing diagram of signals generated by circuits of an analog to digital converter according to an embodiment of the invention.

As shown in FIG. 9, if the digital circuit detects both rising and falling edges in the received sequence, it is enough to use half of the sampled bus width.

For implementing the phase sampling latches, we note that rather than looking for the cross of phase phi[i] with a reference level, we can look for the crossing between phase phi[i] and it's complementary phase phi[(i+K*Nph/2) mod$_{K*Nph}$]. As this gains a factor of 2 in signal amplitude, it also permits shifting the interpolated phases to a lower voltage swing and thus achieving significant power savings.

Figure 10:
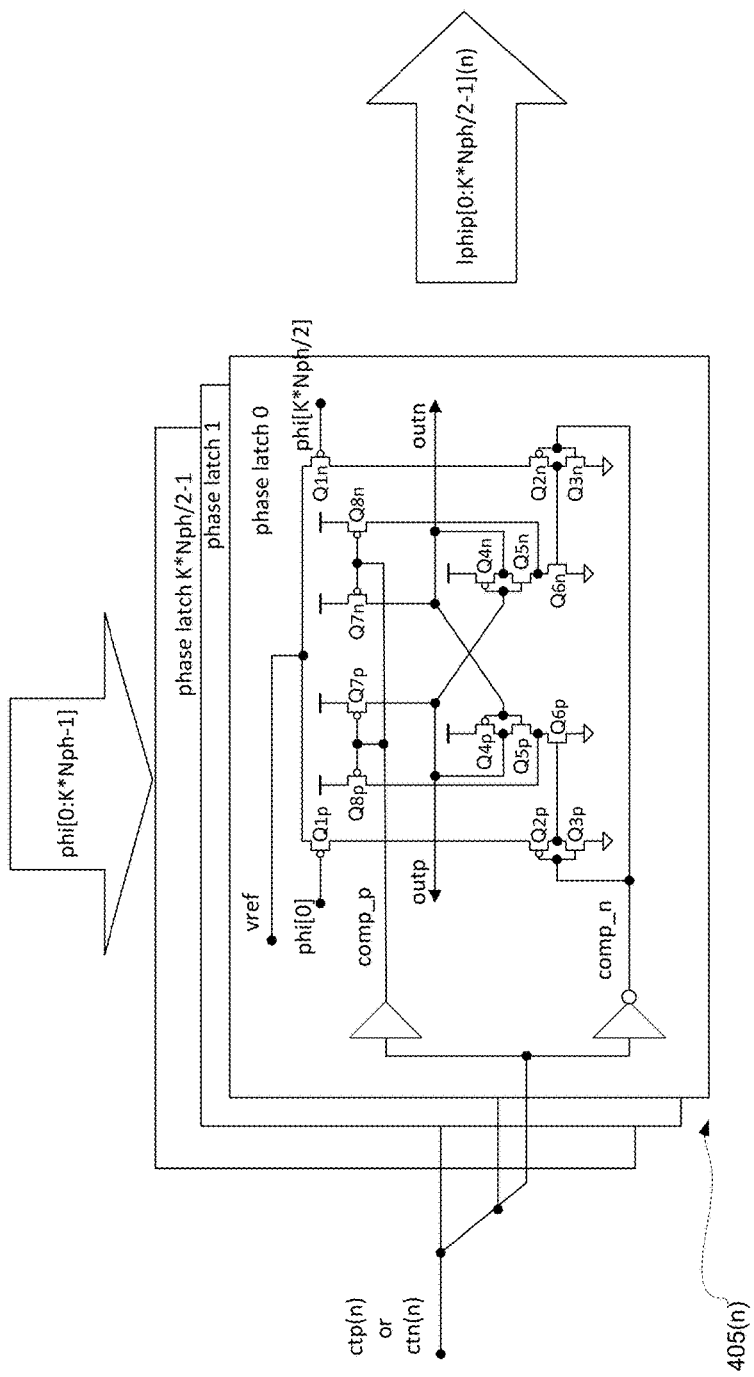
FIG. 10 illustrates circuits of an analog to digital converter according to an embodiment of the invention.
Figure 11:
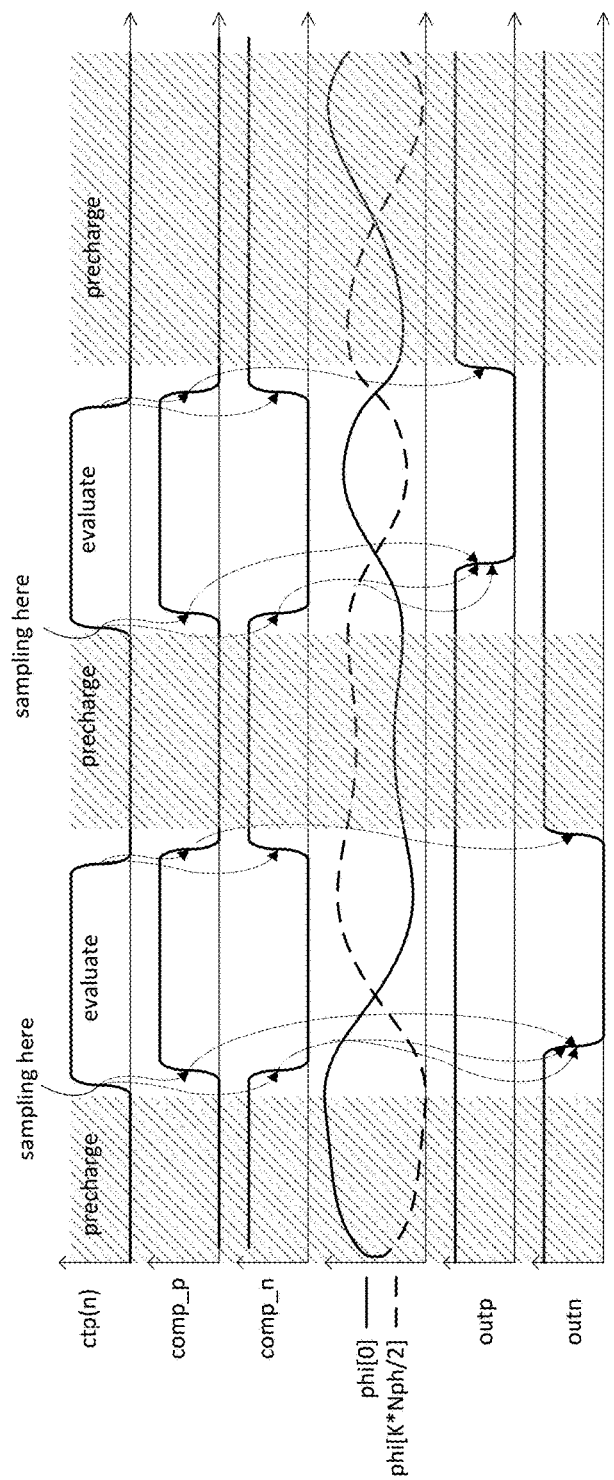
FIG. 11 illustrates a timing diagram of signals generated by circuits of an analog to digital converter according to an embodiment of the invention.

The simplified schematics of a possible implementation of the sampling latch is presented in FIG. 10 and the associated waveforms are shown in FIG. 11.

When the sampling signal ctp(n) or ctn(n) is low, the latch is in pre-charge mode. Both outp and outn are pulled high by devices Q7$p$ and Q7$n$. The regenerative feedback loop formed by Q4$p$, Q5$p$, Q4$n$, Q5$n$ is all pulled up by devices Q8$p$ and Q8$n$. Input devices Q1$p$ and Q1$n$ are in ohmic region but with no current as the current path is interrupted by devices Q2$p$, Q2$n$. The value of the input voltages {phases phi[i] and phi[(i+K*Nph/2)mod$_{K*Nph}$]} determines the ron impedances (gon conductance) of devices Q1$p$ and Q1$n$ (the lower the voltage the lower the impedance). On the rising edge of the sampling signal, these impedances will determine the direction of switching of the regenerative feedback. As long as the sampling signal ctp(n) or ctn(n) remains high (evaluate phase), the latch keeps the valid result of the sampling.

Figure 12:
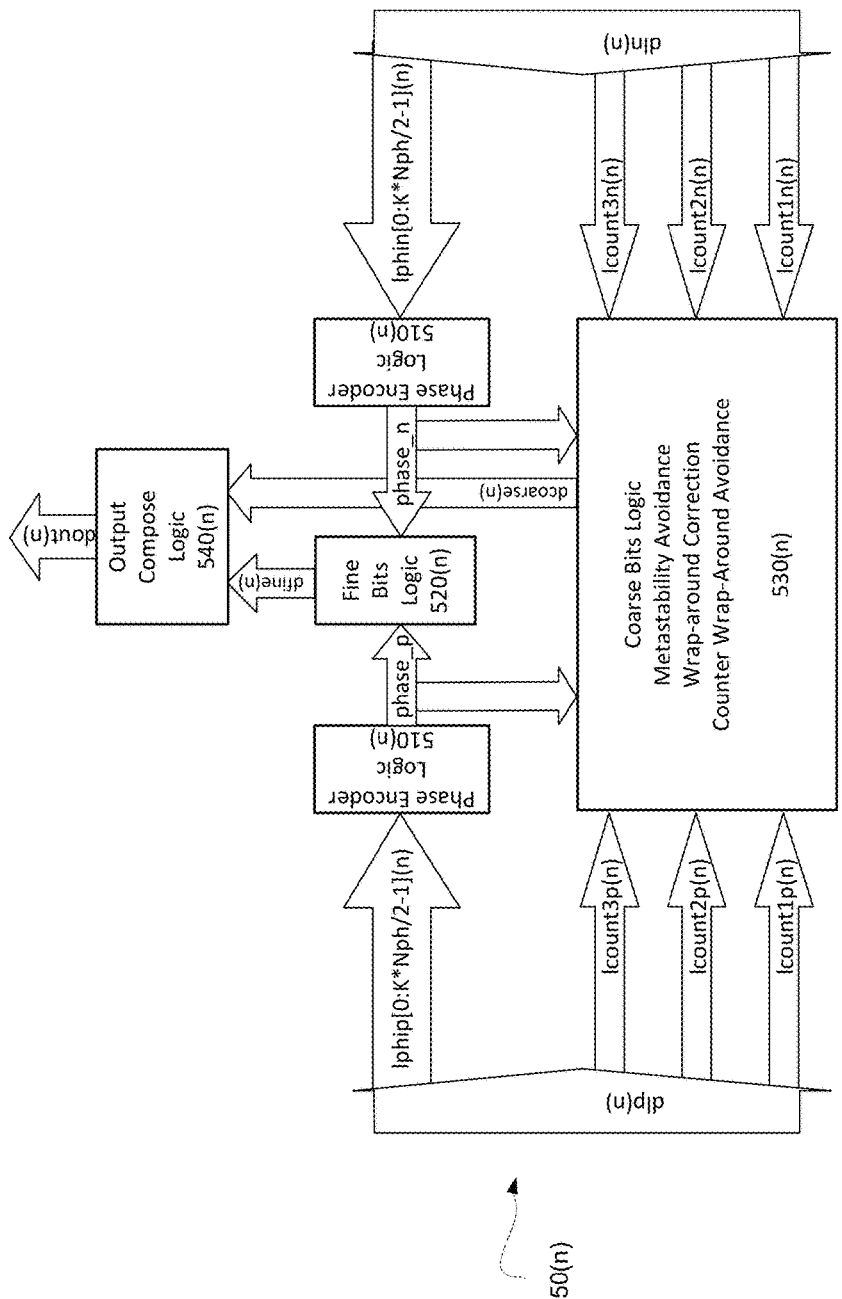
FIG. 12 illustrates circuits of an analog to digital converter according to an embodiment of the invention.

The block schematics of the sub-ADC digital processing unit is shown in FIG. 12.

The inputs to this logic block are the values of the interpolated phases and counters sampled by the latches corresponding to a pair of charge packets Qp(n) and Qn(n) that correspond to a given time sample of the differential input signal Vinp Vinn.

The phase encoder blocks (510($n$)) receive the latched interpolated clock phases (on a half circle wide bus lphip [0:K*Nph/2−1](n) respectively lphin[0:K*Nph/2−1](n)).

The encoding of this bus into a digital number can be implemented in a variety of methods that can use bubble correction, edge detection, thermometer code encoding or priority encoding.

The fine bits are computed by the fine bits logic block $520(n)$ simply by the phase difference between the samplings at the start and at the end events (corresponding to the negative respective positive signals): dfine=$\mod_{K*Nph}$(phase_p−phase_n)

For calculating the coarse bits, the counters are used by the coarse bits logic block $530(n)$ to determine the number of cycles between the relevant edges of the ctp(n) and ctn(n) signals.

Figure 13:
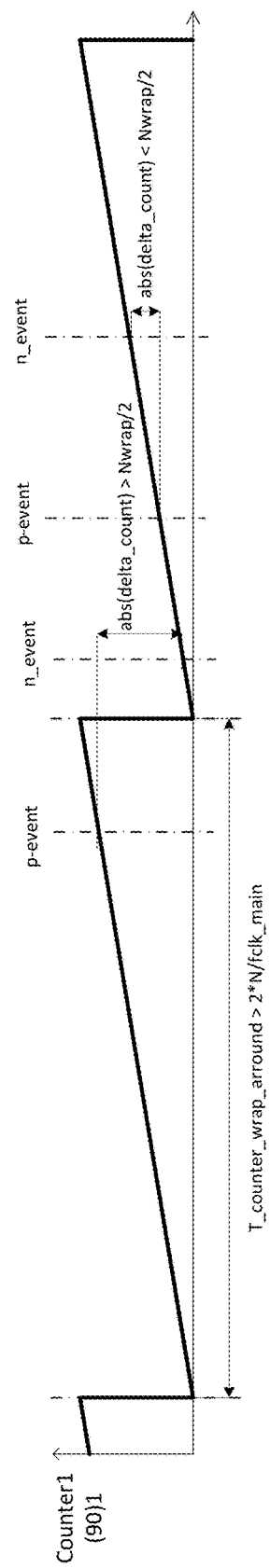
FIG. 13 illustrates a timing diagram of signals generated by circuits of an analog to digital converter according to an embodiment of the invention.

Because the arrival order of the edges of the ctp(n) and ctn(n) signals is not known (depends on the polarity of the input signal), there is no way to distinguish a negative sample from a sample affected by counter wrap-around unless we make sure the counter wrap-around period is larger than twice the channel sampling period as shown in FIG. 13. If the absolute value of the counter difference is larger than Nwrap/2 then the counter wrapped around between the samples and the result needs to be corrected by Nwrap. This can be implemented as the following calculation:

if(abs($I$count1$p(n)$−$I$count1$n(n)$))>$N$wrap/2) then wrapcor_1=1 else wrapcor_1=0;

if(abs($I$count2$p(n)$−$I$count2$n(n)$))>$N$wrap/2) then wrapcor_2=1 else wrapcor_2=0;

if(abs($I$count3$p(n)$−$I$count3$n(n)$))>$N$wrap/2) then wrapcor_3=1 else wrapcor_3=0;

The coarse bit value is the number of cycles between the n-event (edge of ctn(n) signal) and p_event (edge of ctp(n) signal). As shown on FIG. 14, if the arc drawn in positive direction from the n_event to the p_event crosses the phase of the given counter, the counter contains one count in excess of the number of cycles that passed between the two events. Note that if the fine bits are calculated as described above, this is true for both positive and negative values of the counter difference. This can be described by the following calculation:

if($\mod_{K*Nph}$(phase_$n$−$phi$[0])>$\mod_{Nip}$(phase_$p$−$phi$[0])) then decrement_1=1 else decrement_1=0;

if($\mod_{K*Nph}$(phase_$n$−$phi$[$K$*$Nph$/3])>$\mod_{Nip}$(phase_$p$−$phi$[$K$*$Nph$/3])) then decrement_2=1 else decrement_2=0;

if($\mod_{K*Nph}$(phase_$n$−$phi$[2*$K$*$Nph$/3])>$\mod_{Nip}$(phase_$p$−$phi$[2*$K$*$Nph$/3])) then decrement_3=1 else decrement_3=0;

The coarse bits for each of the counters are then calculated as:

$d$coarse_1=$I$count1$p(n)$−$I$count1$n(n)$+ wrapcor_1*$N$wrap−decrement_1;

$d$coarse_2=$I$count2$p(n)$−$I$count2$n(n)$+ wrapcor_2*$N$wrap−decrement_2;

$d$coarse_3=$I$count3$p(n)$−$I$count3$n(n)$+ wrapcor_3*$N$wrap−decrement_3;

If the sampling edges fall upon a counter transition event, the value latched can be affected by metastability. At most two counters can be simultaneously affected by metastability. This leads to the need to use a set of three counters. In the worst case, two of the counters are affected by metastability and this leaves at least one counter clean to be used for the calculation of the coarse bits.

Figure 14:
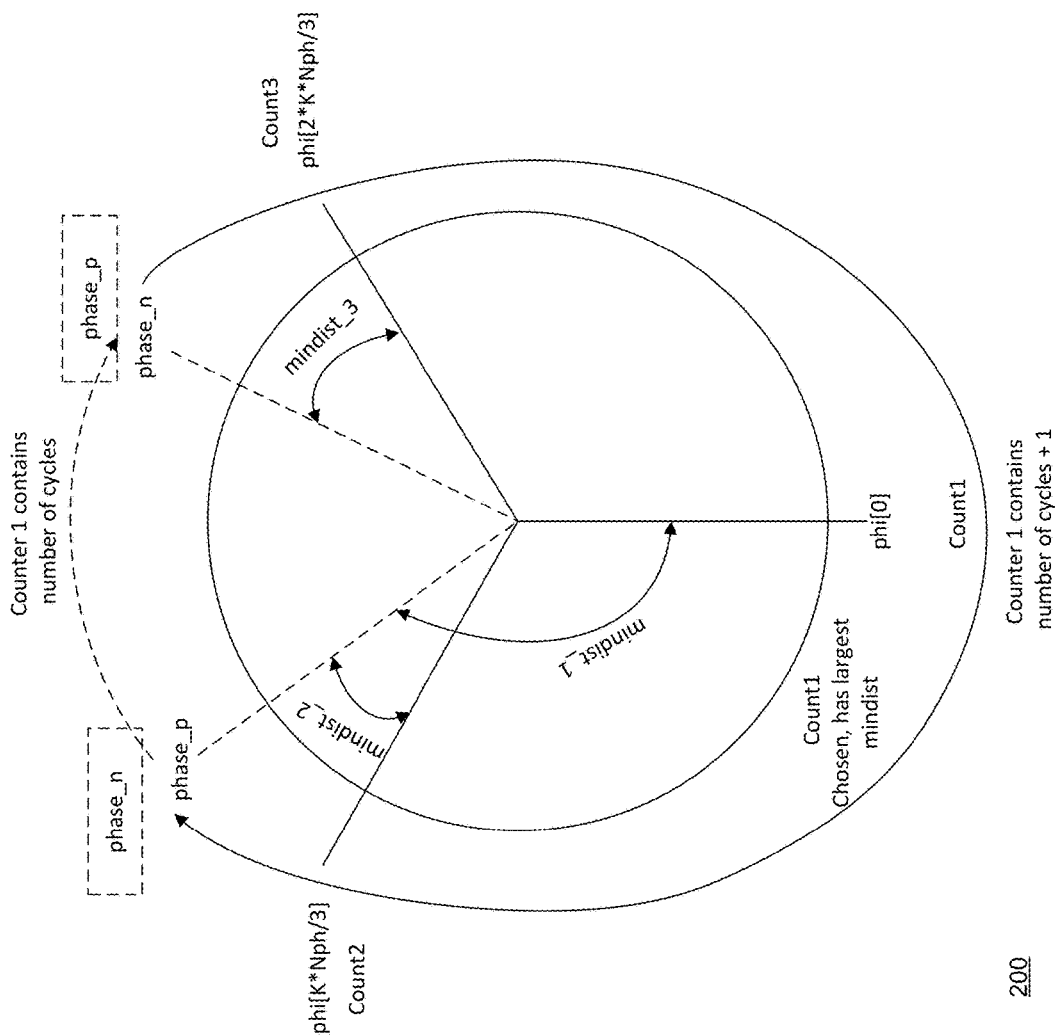
FIG. 14 illustrates various clock phases and decisions related to the various clock phases according to an embodiment of the invention.

The phase diagram in FIG. 14 explain the process of choosing the counter that is least likely to be affected by metastability. For each counter we calculate the minimum distance (in phases) from the nearest of the events (p_event or n_event):

mindist_1=min[$\mod_{K*Nph}$(phase_−$phi$[0]),$\mod_{K*Nph}$($phi$[0]−phase_$p$),$\mod_{K*Nph}$(phase_$n$−$phi$[0]), $\mod_{K*Nph}$($phi$[0]−phase_$n$)]

mindist_2=min[$\mod_{K*Nph}$(phase_$p$−$phi$[$K$*$Nph$/3]), $\mod_{K*Nph}$($phi$[$K$*$Nph$/3]−phase_$p$),$\mod_{K*Nph}$(phase_$n$−$phi$[$K$*$Nph$/3]),$\mod_{K*Nph}$($phi$[$K$*$Nph$/3]−phase_$n$)]

mindist_3=min[$\mod_{K*Nph}$(phase_$p$−$phi$[2*$K$*$Nph$/3]), $\mod_{K*Nph}$($phi$[2*$K$*$Nph$/3]−phase_$p$),$\mod_{K*Nph}$(phase_$n$−$phi$[2*$K$*$Nph$/3]),$\mod_{K*Nph}$($phi$[2*$K$*$Nph$/3]−phase_$n$)]

We choose the counter with the highest minimum phase distance as follows:

if(mindist_1>=max(mindist_2,mindist_3)) then choose counter_1 else if(mindist_2>=mindist_3) then choose counter_2 else choose counter_3

Finally the fine bits and coarse bits are combined together by the output composing logic $540(n)$ in FIG. 12:

$d$out($n$)=$d$coarse($n$)*$K$*$Nph$+$d$fine($n$)

The phase interpolator block 80 (FIG. 1) performs 3 basic functions: Interpolation—increasing the number of the clock phases and thus the resolution of the fine bit section of the ADC, Averaging—by generating the interpolated phases from two or more oscillator phases, the initial mismatch contributions of these phases are averaged and thus their statistical spread decreased, Swing reduction of the interpolated clock signals that helps reduce power.

Figure 15:
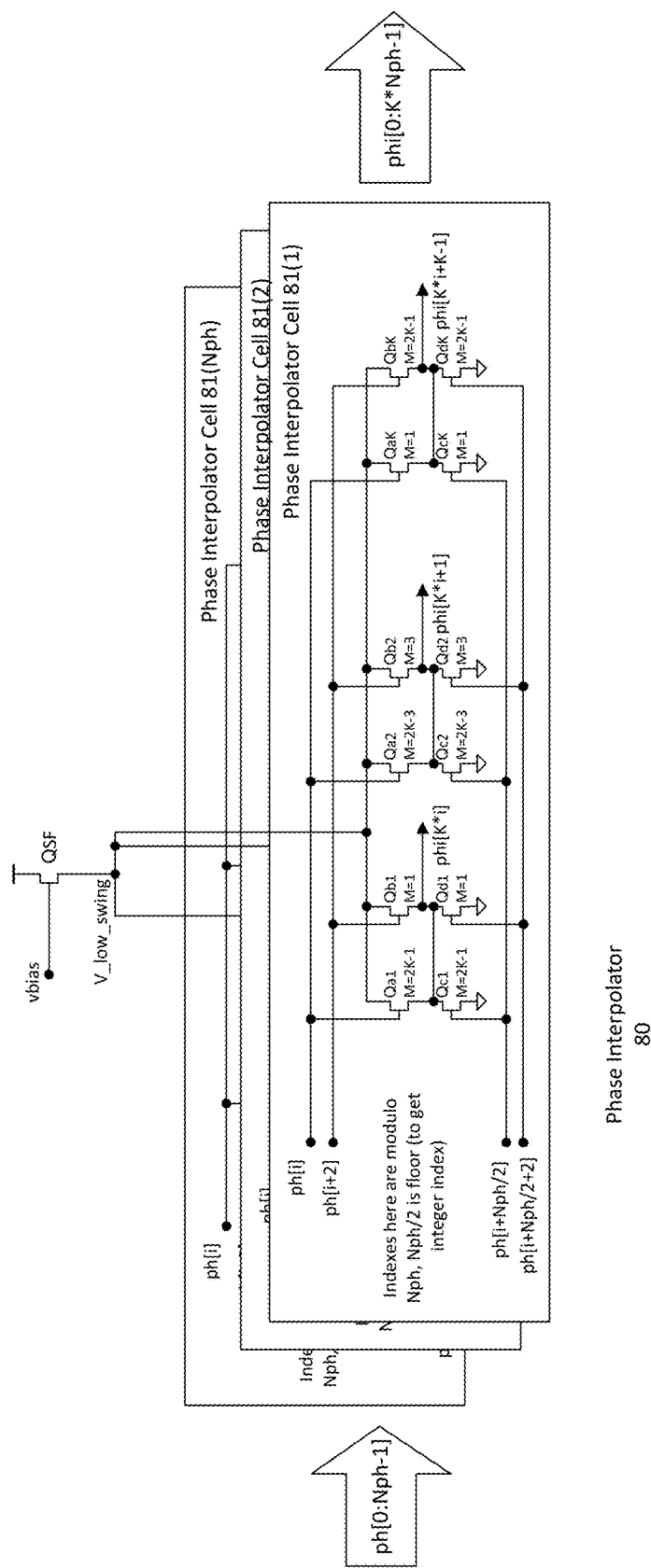
FIG. 15 illustrates circuits of an analog to digital converter according to an embodiment of the invention.

An implementation of a phase interpolation and averaging block is shown in FIG. 15. The corresponding waveforms are presented in FIG. 16.

The amplitude of the interpolated phases is determined by the V_low_swing voltage that is set by means of source follower QSF (that of course also needs a DC bias path not shown here).

The basic interpolation and averaging cell is composed by 4 NMOS devices Qa, Qb, Qc, Qd. The operation of the cell can roughly be described by the following equation:

$t$rise_out=($t$rise_gate_$Qa$*$MQa$+ $t$rise_gate_$Qb$*$MQb$)/($MQa$+$MQb$)

$t$fall_out=($t$rise_gate_$Qc$*$MQc$+$t$rise_gate_$Qd$*$MQd$)/ ($MQc$+$MQd$)

Figure 16:
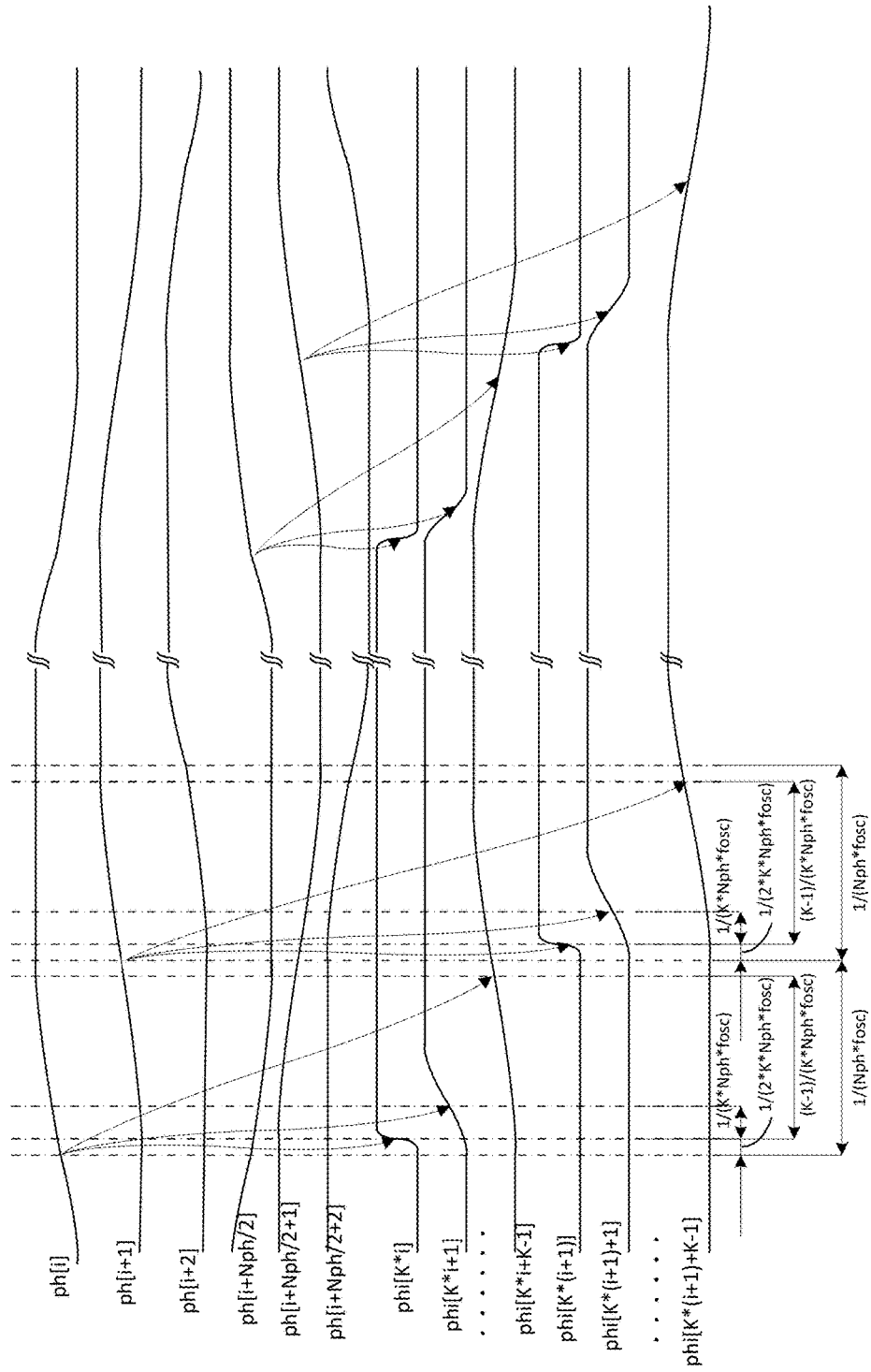
FIG. 16 illustrates a timing diagram of signals generated by circuits of an analog to digital converter according to an embodiment of the invention.

By choosing the multiplicity of the transistors as shown in FIG. 15, the circuit will end up inserting K phases between each two oscillator phases, as shown in FIG. 16. In the example shown here, we deliberately do the interpolation not between adjacent phases (ph[i] and ph[i+1]) but we use the next neighbor (ph[i] and ph[i+2]) in order to better fit the interpolator to the ring oscillator in which (because of the inverting nature of the basic cell) geometrically adjacent phases are (close to) complementary.

It is to be noted that higher order averaging and interpolation structures are possible in which each output transition time is a weighted average of more than two input transition times. For example, one could build a basic interpolation and averaging cell from 6 (or more) devices, where 3 (or more) devices generate the rising edge of the output signal while 3 (or more) devices generate the falling edge. The wider the averaging and interpolation cell is built, the better attenuation of the mismatch effects is achieved.

Also, it is possible to build similar interpolating structures based on PMOS devices or based on a mixture of PMOS and NMOS devices (for example inverters).

A significant amount of power can be saved if instead of generating the K*Nph interpolated phases, we implement the averaging and interpolation function inside the sampling latches.

Figure 17:
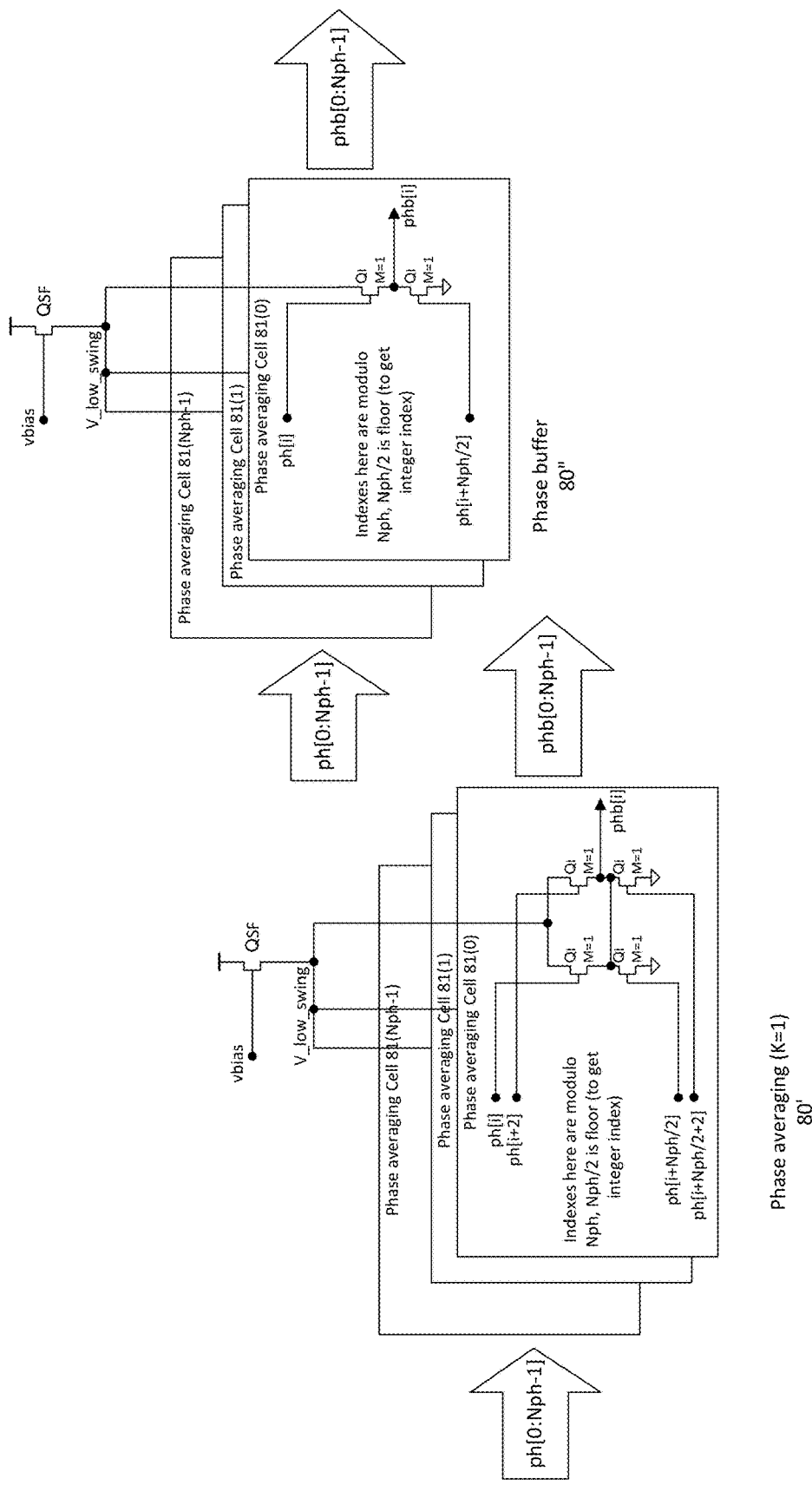
FIG. 17 illustrates circuits of an analog to digital converter according to an embodiment of the invention.

For this implementation, the phase interpolator block 80 can be reduced as shown in FIG. 17 to either an averaging block 80' or further reduced to just a buffering block 80".

The task of interpolating the phases for increasing the resolution of the fine bits is then passed to the phase sampling latches (especially the phase clock interpolating circuit for interpolating the multiple phase-shifted clock signals).

Figure 18:
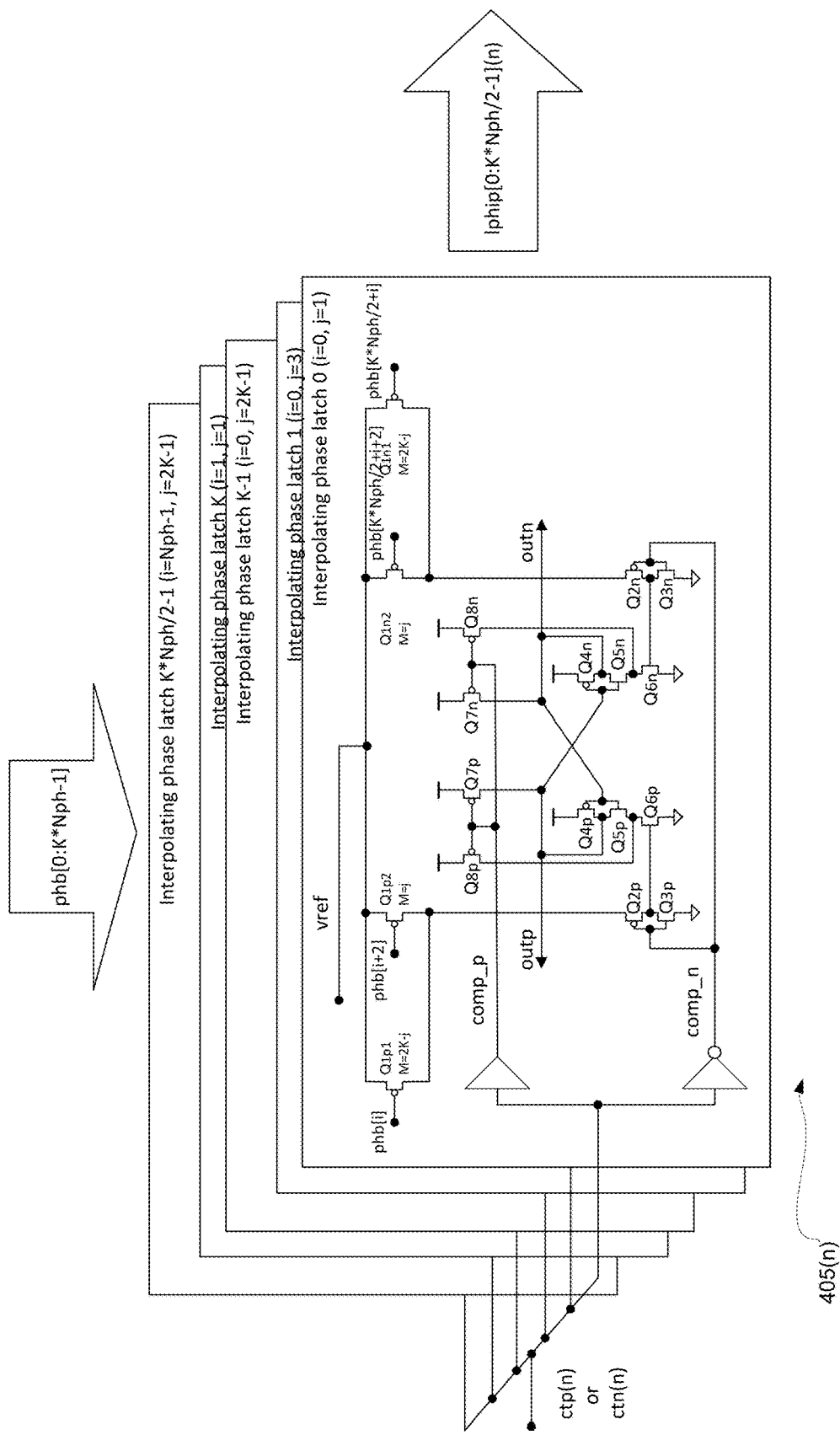
FIG. 18 illustrates circuits of an analog to digital converter according to an embodiment of the invention.

A phase sampling latch can be implemented as shown in FIG. 18. The averaging and interpolating function is implemented by splitting the devices Q1$p$ and Q1$n$ to a first and second groups of transistors that are coupled to first voltage dependent delay circuit (such as Q2$p$ and Q3$p$) and to second voltage dependent delay circuit (such as Q2$n$ and Q3$n$) respectively (compare to FIG. 10). The equivalent conductance that now determines the switching of the regenerative feedback is a weighted sum of the conductances of the individual devices.

For explaining the basis of the averaging and interpolating functionality of the latch shown in FIG. 18, we start from the simple latch shown in FIG. 10. For the latch in FIG. 10, the direction of the flipping of the regenerative feedback is governed by the inequality: outp=1 if $g_{onQ1p} < g_{onQ1n}$ As $g_{on} \sim M(Vgs-Vth)$ (neglecting the quadratic term) we get:

out$p$=1 if $M_{Q1p}(VgS_{Q1p}-Vth_{Q1p}) < M_{Q1n}(VgS_{Q1np}-Vth_{Q1n})$

Going now for the circuit in FIG. 18, the equivalent conductance of the Q1$p$1, Q1$p$2 respectively Q1$n$1, Q1$n$2 ensembles is the sum of the conductivities of each individual device.

Thus the decision inequality becomes: out$p$=1 if
$(M_{Q1p1}*VgS_{Q1p1}+M_{Q1p2}*VgS_{Q1p2})-$
$(M_{Q1p1}*Vth_{Q1p1}+M_{Q1p2}*Vth_{Q1p2}) <<$
$(M_{Q1n1}*VgS_{Q1n1}+M_{Q1n2}*VgS_{Q1n2})-$
$(M_{Q1n1}*Vth_{Q1n1}+M_{Q1n2}*Vth_{Q2n2})$ From this expression we see the interpolating effect on the input voltages and also the averaging of the threshold voltages of the devices. The weights of the interpolation are again the multiplicity factors of the devices.

There may be provided an ADC that may differ from the previously presented ADC by solving the counter wrap-around issue by resetting the counters at every conversion cycle. This is possible for non-time interleaved structures.

A traditional two step ADC architecture is chosen with the difference that the quantization is done in time domain instead of voltage domain. The use of a multi-phase PLL permits using the clock phases for defining the fine quantization while counting clock periods is used for the coarse bits. In this fashion the fine to coarse gain is equal to the number of phases of the PLL and so it is accurate by construction.

The ADC includes a multi-phase ring oscillator, interpolate it to a level of some ps interval between phases and use it in conjunction with a PWM modulator (V2T converter) to build an ADC. In order to be able to share the oscillator and counters between several ADC branches, the oscillator is locked to the reference clock.

The ADC converts to a signed number the time difference between the positive and negative PWM branches. Because the arrival order of the positive branch and negative branch events depends on the polarity of the input signal, the wrap-around of the counters can not be distinguished from polarity change in input signal. The counters in are for this reason reset every sampling cycle.

The oscillator is built with np phases that are further interpolated to nip=np*ninterp total phases.

For example –np=45, ninterp=2, nip=90.

Figure 19:
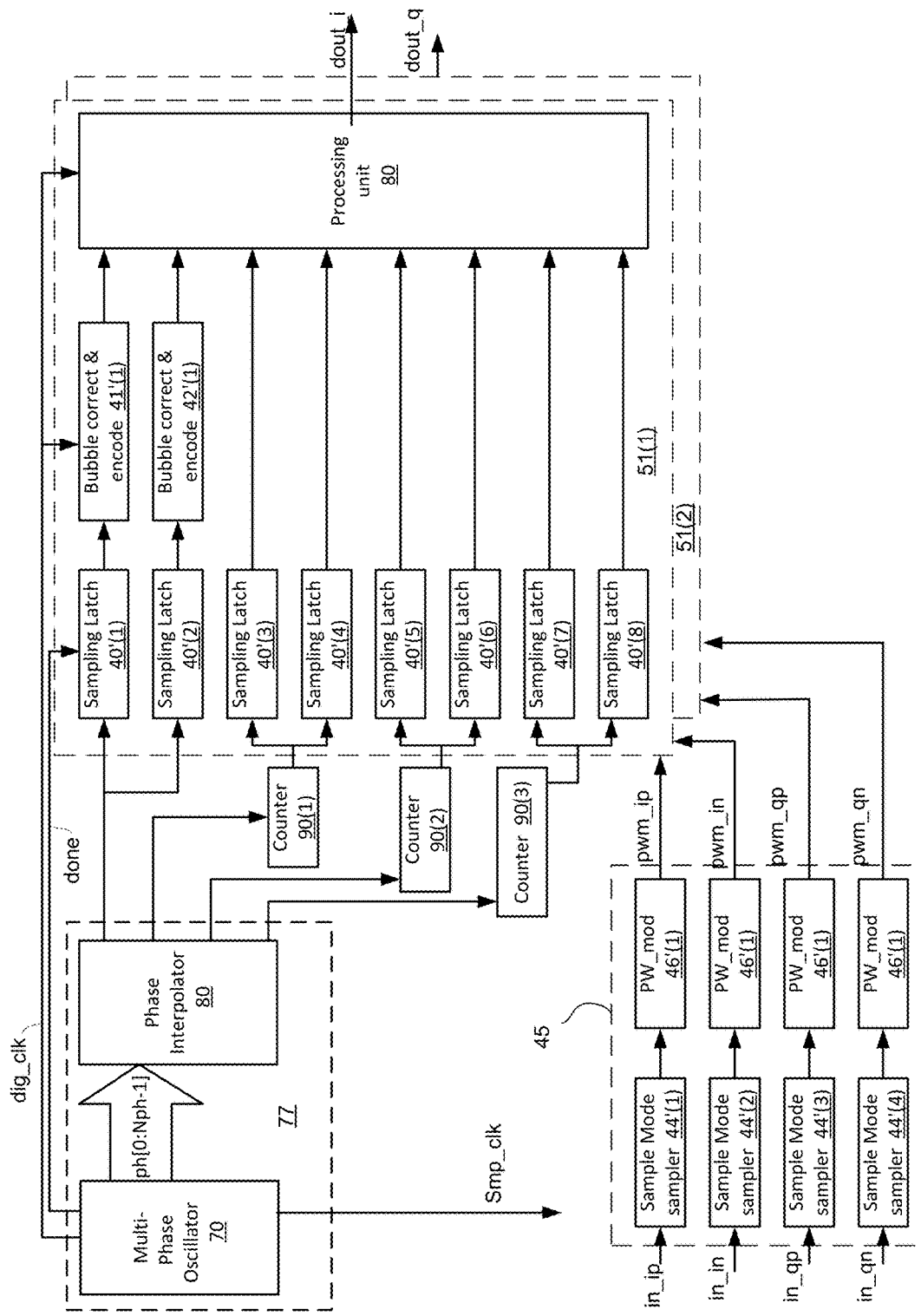
FIG. 19 illustrates circuits of an analog to digital converter according to an embodiment of the invention.

The block schematics is presented in FIG. 19.

The fine (lower) bits are determined by sampling the ends of the PWM pulses corresponding to the positive respective negative signal branches with latches and determining the phase difference.

The coarse bits are determined using a set of 3 counters set at approximately 120 degrees on the phase diagram.

The ADC is built from 2 identical single ended sections that operate in differential fashion. The digital processing block of each of the I and Q branches also contains a DC removal block.

In each of the two differential ADC sections, the fine bits are computed simply by the phase difference between the samplings at the start and at the end events (corresponding to the negative respective positive signals):

$$N\text{fine} = \text{mod}_{Nip}(phi\_end - phi\_start)$$

This can be implemented as:

$$N\text{fine} = \begin{cases} phi\_end - phi\_start & \text{if } phi\_end > phi\_start \\ Nip + phi\_end - phi\_start & \text{if } phi\_end \leq phi\_start \end{cases}$$

Note that we denote here as start event the negative signal related event and as end event the positive signal related one (for reasons of compatibility with previous versions).

Also note that modulo Nip operation used in the following equations can be implemented as shown above for Nfine (because the phase differences are always in the range –Nip+1 to Nip-1).

The coarse bits are computed as the signed number of cycles from the count difference sampled at end and start events. The counters count the number of rising edges that fall within the two events.

The sampling of the counters can be affected by metastability if the edge of the start or end event falls in the vicinity of the rising edge of the phase associated with the counter. At most 2 counters can be simultaneously affected by metastability so that this guarantees that we always have at least one clean counter.

For choosing the counter, for each counter we calculate the minimum absolute phase difference between the start and end events and the position of the counter:

$$mindeltaph\_a = \min[\mod_{Nip}(phi\_end-phi\_a), \mod_{Nip}(phi\_a-phi\_end),$$

$$\mod_{Nip}(phi\_start-phi\_a), \mod_{Nip}(phi\_a-phi\_start)]$$

$$mindeltaph\_b = \min[\mod_{Nip}(phi\_end-phi\_b), \mod_{Nip}(phi\_b-phi\_end),$$

$$\mod_{Nip}(phi\_start-phi\_b), \mod_{Nip}(phi\_b-phi\_start)]$$

$$mindeltaph\_c = \min[\mod_{Nip}(phi\_end-phi\_c), \mod_{Nip}(phi\_c-phi\_end),$$

$$\mod_{Nip}(phi\_start-phi\_c), \mod_{Nip}(phi\ c-phi\_start)]$$

Figure 20:
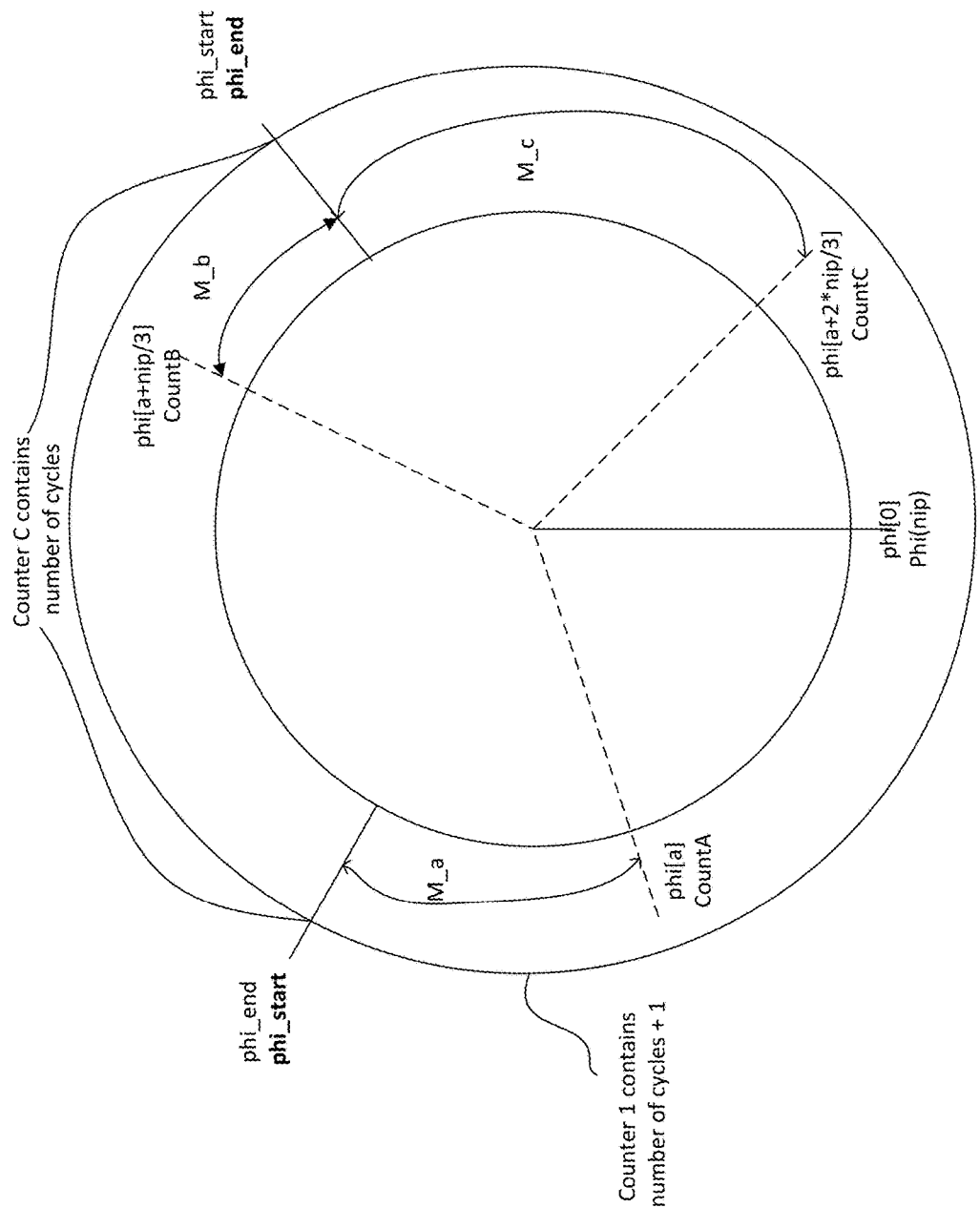
FIG. 20 illustrates various clock phases and decisions related to the various clock phases according to an embodiment of the invention

We choose the counter with the highest minimum phase distance as follows:

if(mindeltaph_a>=max(mindeltaph_b,mindeltaph_c))
 then choose A else
 if(mindeltaph_b>=mindeltaph_c) then choose B
 else choose C As shown in FIG. 20, the output of the chosen counter has to be decremented in case the phase associated with the chosen counter falls between the start phase and the end phase (in the positive counting direction). This can be described as follows:

if($\mod_{Nip}(phi\_start-phi\_a) > \mod_{Nip}(phi\_end-phi\_a)$)
 then decrement_a=1 else decrement_a=0 if($\mod_{Nip}(phi\_start-phi\_b) > \mod_{Nip}(phi\_end-phi\_b)$)
 then decrement_b=1 else decrement_b=0 if($\mod_{Nip}(phi\_start-phi\_c) > \mod_{Nip}(phi\_end-phi\_c)$)
 then decrement_c=1 else decrement c=0

It is important to note that error in the decision to decrement the counter is self-correcting.

The coarse bits are then computed as dcoarse=cout_end−count_start−decrement

Note that the coarse bits are a signed quantity (so implemented as 2's complement).

The final output is then computed as:

$$Dout = dcoarse * Nip + nfine$$

Figure 21:
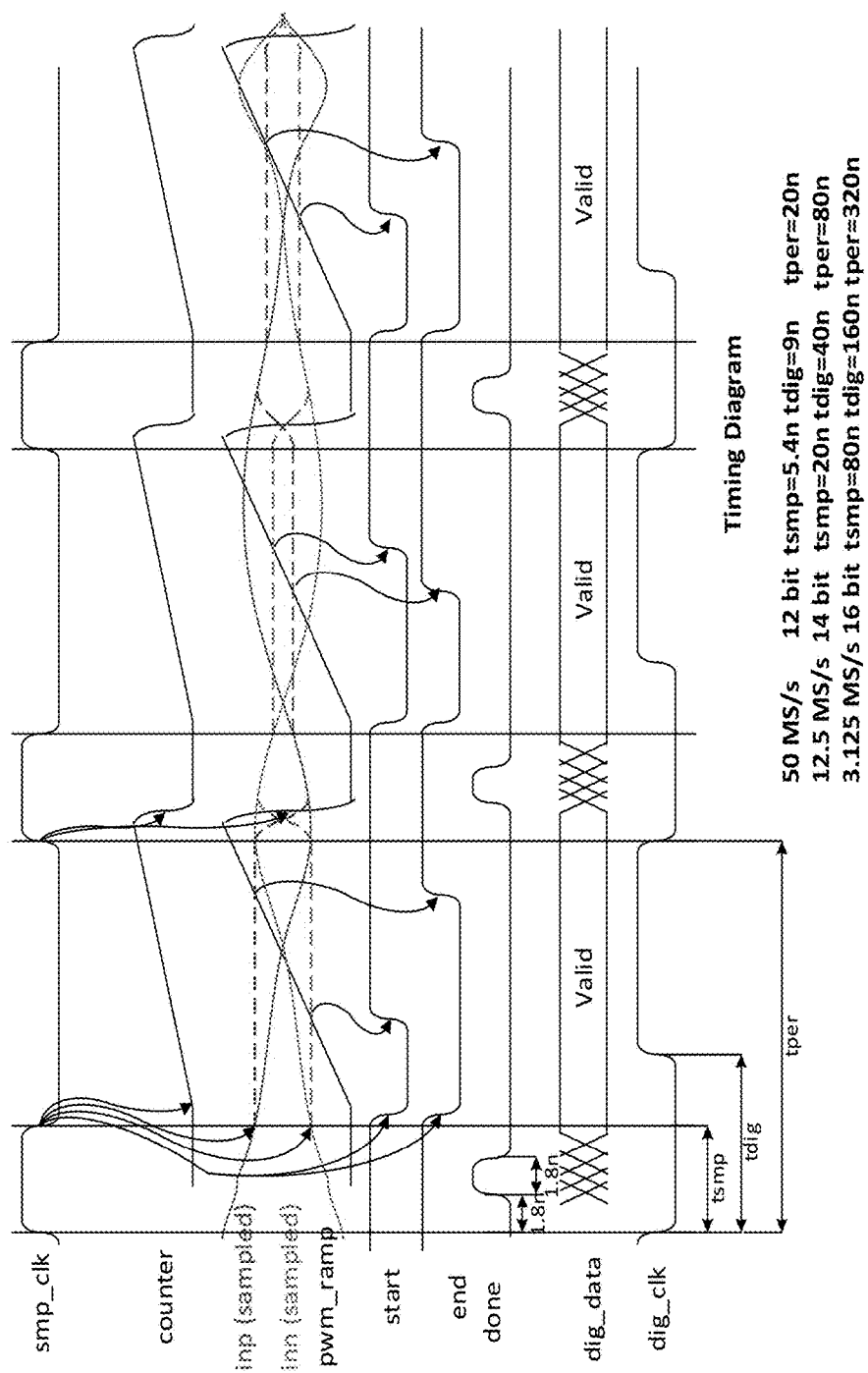
FIG. 21 illustrates a timing diagram of signals generated by circuits of an analog to digital converter according to an embodiment of the invention.

The timing sequence of the signal sampling, voltage to time conversion and interface to digital processing is presented in FIG. 21.

Figure 22:
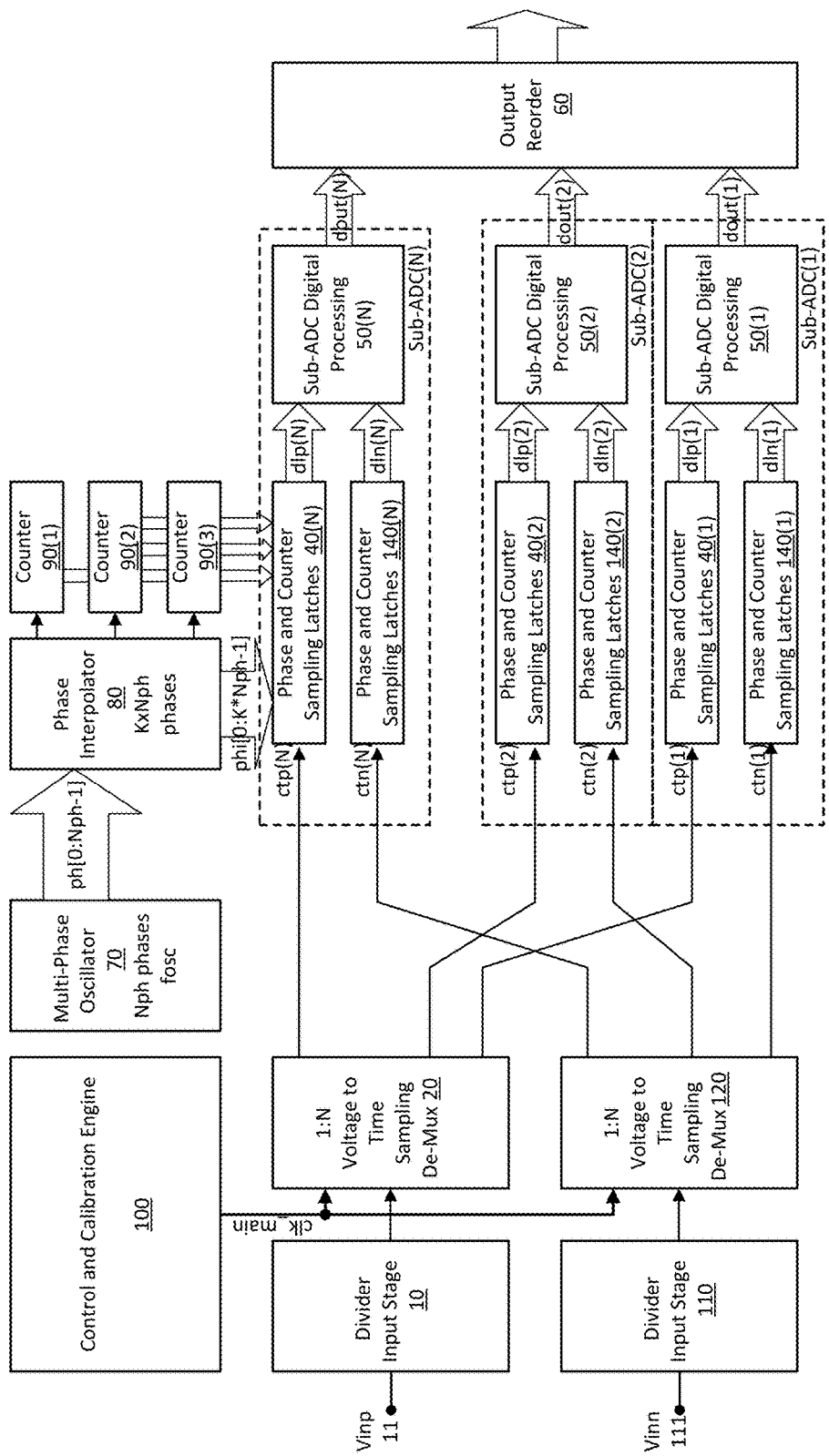
FIG. 22 illustrates circuits of an analog to digital converter according to an embodiment of the invention.

The block schematics of another implementation of the ADC is shown in FIG. 22. The input stage 10 (110) in this case is a simple resistor divider (that can even be omitted or replaced by other similar functionality constructs. The charge domain sampling de-mux 20 (120) from FIG. 1 is now replaced by a voltage domain structure that provides a lower complexity more compact implementation and also performs the voltage to time conversion. The rest of the blocks of the ADC remain unchanged. It is to be noted that for lower resolution implementations, the coarse logic and counters can be omitted leading to a one step flash type of implementation. The phase interpolation can be done as shown in FIG. 22 or with interpolating latches (see FIG. 18) or as a combination of both methods.

FIG. 22 illustrates an example of an analog to digital converter that includes:

a. A multi-phase clock unit (multi-phase oscillator and phase interpolator 80) that is configured to output multiple phase-shifted clock signals that are phase shifted from each other; (b) a first voltage to time sampling de-multiplexer (20) that may include a first demultiplexer (see node Vsmp shared by all voltage to time units 20(1)-20(N) of FIG. 23, and different times select clock signals Sel_clk(1)(N))) and first plurality of first time to voltage units (20(1)-20(N) of FIG. 23). The first demultiplexer is configured to receive a sequence of first plurality of first input analog signals, and to distribute the sequence of first plurality of first input analog signals between the first plurality of first voltage to time units, so that each first voltage to time unit receives a different first input analog signal of the sequence of first plurality of first input analog signals. Each first voltage to time unit (20(n), n ranges between 1 and N) may include a first inverter (Q11, Q22)) that is configured to output a first pulse that has a duration that is indicative of a value of a first input analog signal fed to the first voltage to time unit.

b. Second voltage to time sampling de-multiplexer (120) that may include a second demultiplexer and first plurality of second time to voltage units. The second demultiplexer is configured to receive a sequence of first plurality of first input analog signals, and to distribute the sequence of first plurality of second input analog signals between the first plurality of second voltage to time units, so that each second voltage to time unit receives a different second input analog signal of the sequence of first plurality of second input analog signals. Each second voltage to time unit may include a second inverter that is configured to output a second pulse that has a duration that is indicative of a value of a second input analog signal fed to the second voltage to time unit.

c. Second plurality of counters (90(1)-90(3). Different counters are fed by different phase-shifted clock signals, wherein the different phase-shifted clock signals are evenly phase shifted from each other; first plurality of being an integer.

d. A first plurality of pairs of timing units (40(1)-40(N) and 140(1)-140(N)). Each pair of timing units is (a) coupled to a different pair of first time to voltage unit and a second time to voltage unit, and (b) is configured to determine a difference in phase-shifted clock signals between an end of the first pulse generated by the first time to voltage unit and an end of the second pulse generated by the second time to voltage unit. For example timing unit 40(n) receives ctp(n) and ctn(n) and outputs dout(n).

e. At least one processing unit (50(1)-50(N) and 60) that is fed by the first plurality of timing unit and is configured to generate a first plurality of digital output signals indicative of differences between the first plurality of first input analog signals and corresponding second plurality of second input analog signals.

Figure 23:
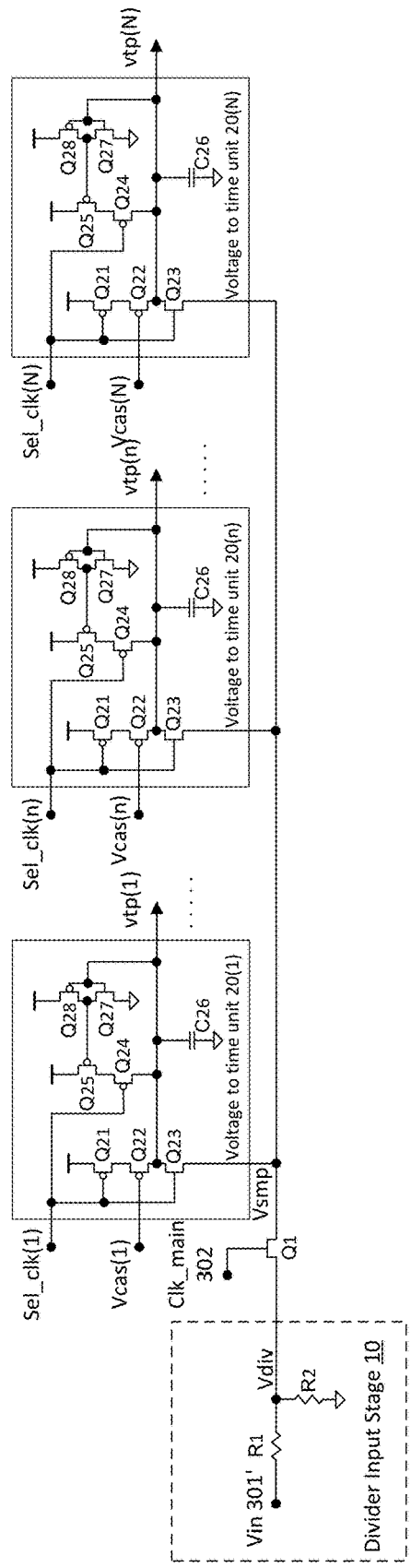
FIG. 23 illustrates circuits of an analog to digital converter according to an embodiment of the invention.
Figure 24:
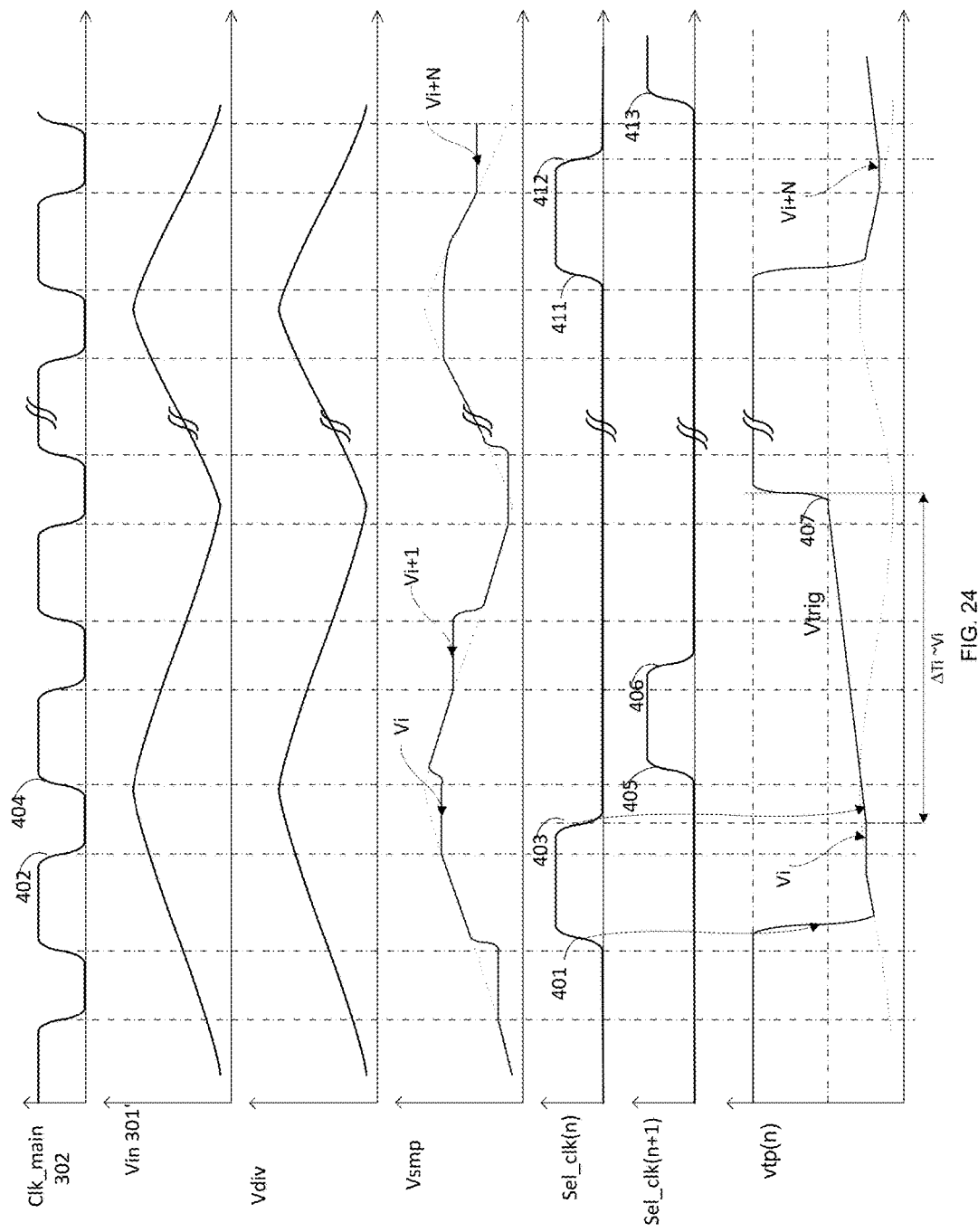
FIG. 24 illustrates a timing diagram of signals generated by circuits of an analog to digital converter according to an embodiment of the invention.

The concept schematic is shown in FIG. 23 and associated waveforms in FIG. 24.

The sampling concept (similar to the charge domain one presented before) uses Clk_main (302) full speed clock to achieve a sampling that does not need time difference calibration. The arrangement of the control signals of the individual voltage to time units 20(n) is such that the decisive event for the sampling of the input voltage is the falling edge of Clk_main 402 so there is no need to calibrate for timing skew between the individual Sel_clk(n) signals.

It is to be noted that based on this principle different implementations of the voltage (besides the one described in what follows) to time units 20(n) can be used.

The operating sequence of the voltage to time units 20(n) is as follows:

When Sel_clk(n) and Clk_main are high 401, the divided input voltage Vdiv I sampled on capacitor C26(n) (via devices Q1 and Q23(n)).

The instance of sampling is determined by the falling edge of Clk_main 402

After the sampling, Sel_clk(n) goes low and the capacitor C26(n) starts a process of Iinear charging through devices Q21(n), Q22(n) that form a current source 403

The process for the next voltage to time unit 20(n+1) starts in an interleaved fashion 404, 405, 406

When the voltage vtp(n) on capacitor C26(n) reaches the trigger voltage Vtrig of the inverter formed by Q27(n), Q28(n) (for a modern technology this is basically the threshold voltage of NMOS device Q27(n)), the path Q24(n) Q25(n) conducts and charges C26(n) fast to the supply voltage 407.

After the de-mux made a complete cycle (N individual samples have been processed, it is again time for circuit 20(n) to operate 411,412.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Any reference to any of the terms "comprise", "comprises", "comprising" "including", "may include" and "includes" may be applied to any of the terms "consists", "consisting", "consisting essentially of". For example—any of the circuits illustrated in any figure may include more components that those illustrated in the figure, only the components illustrated in the figure or substantially only the components illustrate din the figure.

Also for example, in one embodiment, the illustrated examples may be implemented as circuitry located on a single integrated circuit. Alternatively, the examples may be implemented as any number of separate integrated circuits or separate common mode noise chokes interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

We claim:

1. An analog to digital converter comprising:
   a multi-phase clock unit that is configured to output multiple phase-shifted clock signals that are phase shifted from each other;
   a first sampler that is configured to sample, during a sampling iteration, a first input analog signal to provide a first voltage signal that represents the first input analog signal;
   a first pulse width modulation (PWM) modulator that is coupled to the first sampler and is configured to generate a first PWM pulse that represents the first voltage signal;
   a second sampler that is configured to sample, during the sampling iteration, a second input analog signal to provide a second voltage signal that represents the second input analog signal;

a second PWM modulator that is coupled to the second sampler and is configured to generate a second PWM pulse that represents the second voltage signal;

N counters, wherein different counters are fed by different phase-shifted clock signals, wherein the different phase-shifted clock signals are evenly phase shifted from each other; N being an integer;

N pairs of sampling latches; wherein different pairs of sampling latches are coupled to different counters; and a processing unit;

wherein a first sampling latch of each pair is configured to sample an output of a corresponding counter at (a) a start of the first PWM pulse, and at (b) an end of the first PWM pulse, to provide a first PWM pulse start counter value and a first PWM pulse end counter value;

wherein a second sampling latch of each pair is configured to sample an output of a corresponding counter at (a) a start of the second PWM pulse, and at (b) an end of the second PWM pulse, to provide a second PWM pulse start counter value and a second PWM pulse end counter value;

wherein the processing unit is configured to (a) receive from first sampling latches of the N pairs of sampling latches, N first PWM pulse start counter values and N first PWM pulse end counter value, (b) receive from second sampling latches of the N pairs of sampling latches, N second PWM pulse start counter values and N second PWM pulse end counter value; (c) select a counter that is coupled to a selected sampling latch; (d) calculate an estimated difference between the first input analog signal and the second input analog signal based on at least readings of the selected latch; wherein the readings of the selected counter comprise a first PWM pulse start counter value latched by the selected latch, a first PWM pulse end counter value latched by the selected latch, a second PWM pulse start counter value latched by the selected latch, and a second PWM pulse end counter value latched by the selected latch; and (e) output a digital output signal indicative of the estimated difference.

2. The analog to digital converter according to claim 1 wherein the N counters are configured to be reset between one sampling iteration to another.

3. The analog to digital converter according to claim 1 wherein each counter of the N counters are configured to count a period that is at least twice a sampling cycle; and wherein the processing unit is configured to detect counter overflow based on a difference between PWM pulse end and start counter values.

4. The digital to analog converter according to claim 1 comprising an initial pair of sampling latches that are configured to detect during which phase-shifted clock signal of the output multiple phase-shifted clock signals the first PWM pulse ended and during which phase-shifted clock signal of the output multiple phase-shifted clock signals the second PWM pulse ended.

5. The digital to analog converter according to claim 4 comprising a pair of bubble correct and encode units that are coupled between the initial pair of sampling latches and the processing unit.

6. The digital to analog converter according to claim 4 wherein each sampling latch of the initial pair of latches comprises a phase clock interpolating circuit for interpolating the multiple phase-shifted clock signals.

7. The digital to analog converter according to claim 6 wherein the phase clock interpolating circuit comprises a first group of parallelly coupled transistors that are fed by a first group of phase-shifted signals, a second group of parallelly coupled transistors that are fed by a second group of phase-shifted signals; a first inverter that is coupled to the first group, a second inverter that is coupled to the second group; wherein the first inverter is configured to switch between operation modes based on a conductance of the first group and on the first PWM pulse; and wherein the second inverter is configured to switch between operation modes based on a conductance of the second group and on the second PWM pulse.

8. The digital to analog converter according to claim 1, comprising:

a third sampler that is configured to sample, during a sampling iteration, a third input analog signal to provide a third voltage signal that represents the third input analog signal;

a third PWM modulator that is coupled to the third sampler and is configured to generate a third PWM pulse that represents the third voltage signal;

a fourth sampler that is configured to sample, during the sampling iteration, a fourth input analog signal to provide a fourth voltage signal that represents the fourth input analog signal;

a fourth PWM modulator that is coupled to the fourth sampler and is configured to generate a fourth PWM pulse that represents the fourth voltage signal; and N pairs of additional sampling latches; wherein different pairs of additional sampling latches are coupled to different counters; and an additional processing unit;

wherein a third sampling latch of each pair is configured to sample an output of a corresponding counter at (a) a start of the third PWM pulse, and at (b) an end of the third PWM pulse, to provide a third PWM pulse start counter value and a third PWM pulse end counter value;

wherein a fourth sampling latch of each pair is configured to sample an output of a corresponding counter at (a) a start of the fourth PWM pulse, and at (b) an end of the fourth PWM pulse, to provide a fourth PWM pulse start counter value and a fourth PWM pulse end counter value;

wherein the additional processing unit is configured to (a) receive from third sampling latches of the N pairs of sampling latches, N third PWM pulse start counter values and N third PWM pulse end counter value, (b) receive from fourth sampling latches of the N pairs of sampling latches, N fourth PWM pulse start counter values and N fourth PWM pulse end counter value; (c) select a counter that is coupled to a selected sampling latch; (d) calculate an estimated difference between the third input analog signal and the fourth input analog signal based on at least readings of the selected latch; wherein the readings of the selected counter comprise a third PWM pulse start counter value latched by the selected latch, a third PWM pulse end counter value latched by the selected latch, a fourth PWM pulse start counter value latched by the selected latch, and a fourth PWM pulse end counter value latched by the selected latch; and (e) output a digital output signal indicative of the estimated difference.

9. A method for analog to digital conversion, the method comprises:

outputting, by a multi-phase clock unit, multiple phase-shifted clock signals that are phase shifted from each other;

sampling, by a first sampler, during a sampling iteration, a first input analog signal to provide a first voltage signal that represents the first input analog signal;

generating, by a first pulse width modulation (PWM) modulator that is coupled to the first sampler, a first PWM pulse that represents the first voltage signal;

sampling, by a second sampler, during the sampling iteration, a second input analog signal to provide a second voltage signal that represents the second input analog signal;

generating, by a second PWM modulator that is coupled to the second sampler, a second PWM pulse that represents the second voltage signal;

feeding N counters by the multiple phase-shifted clock signals, wherein the different counters are fed by different phase-shifted clock signals that are evenly phase shifted from each other; N being an integer;

sampling, by a first sampling latch of each pair of N sampling latches, an output of a corresponding counter at (a) a start of the first PWM pulse, and at (b) an end of the first PWM pulse, to provide a first PWM pulse start counter value and a first PWM pulse end counter value;

sampling, by a second sampling latch of each pair of N sampling latches, an output of a corresponding counter at (a) a start of the second PWM pulse, and at (b) an end of the second PWM pulse, to provide a second PWM pulse start counter value and a second PWM pulse end counter value;

receiving, by a processing unit, from first sampling latches of the N pairs of sampling latches, N first PWM pulse start counter values and N first PWM pulse end counter value;

receiving, by the processing unit, from second sampling latches of the N pairs of sampling latches, N second PWM pulse start counter values and N second PWM pulse end counter value;

selecting, by the processing unit, a counter that is coupled to a selected sampling latch;

calculating, by the processing unit, an estimated difference between the first input analog signal and the second input analog signal based on at least readings of the selected latch; wherein the readings of the selected counter comprise a first PWM pulse start counter value latched by the selected latch, a first PWM pulse end counter value latched by the selected latch, a second PWM pulse start counter value latched by the selected latch, and a second PWM pulse end counter value latched by the selected latch; and outputting a digital output signal indicative of the estimated difference.

10. An analog to digital converter comprising:

a multi-phase clock unit that is configured to output multiple phase-shifted clock signals that are phase shifted from each other;

a first voltage to time sampling de-multiplexer that comprises a first demultiplexer and first plurality of first time to voltage units; wherein the first demultiplexer is configured to receive a sequence of first plurality of first input analog signals, and to distribute the sequence of first plurality of first input analog signals between the first plurality of first voltage to time units, so that each first voltage to time unit receives a different first input analog signal of the sequence of first plurality of first input analog signals; wherein each first voltage to time unit comprises a first voltage dependent delay circuit that is configured to output a first pulse that has a duration that is indicative of a value of a first input analog signal fed to the first voltage to time unit;

a second voltage to time sampling de-multiplexer that comprises a second demultiplexer and first plurality of second time to voltage units; wherein the second demultiplexer is configured to receive a sequence of first plurality of first input analog signals, and to distribute the sequence of first plurality of second input analog signals between the first plurality of second voltage to time units, so that each second voltage to time unit receives a different second input analog signal of the sequence of first plurality of second input analog signals; wherein each second voltage to time unit comprises a second voltage dependent delay circuit that is configured to output a second pulse that has a duration that is indicative of a value of a second input analog signal fed to the second voltage to time unit;

a second plurality of counters, wherein different counters are fed by different phase-shifted clock signals, wherein the different phase-shifted clock signals are evenly phase shifted from each other; first plurality of being an integer;

a first plurality of pairs of timing units; wherein each pair of timing units is (a) coupled to a different pair of first time to voltage unit and a second time to voltage unit, and (b) is configured to determine a difference in phase-shifted clock signals between an end of the first pulse generated by the first time to voltage unit and an end of the second pulse generated by the second time to voltage unit; and at least one processing unit that is fed by the first plurality of timing unit and is configured to generate a first plurality of digital output signals indicative of differences between the first plurality of first input analog signals and corresponding second plurality of second input analog signals.

11. The analog to digital converter according to claim 10, wherein each timing unit comprises a latch that is configured to determine during which phase-shifted clock signal the end of the first pulse occurred, during which phase-shifted clock signal the end of the second pulse occurred; and to determine whether any counter value changed between the ends of the first and second pulses.

* * * * *